(12) United States Patent
Aggarwal et al.

(10) Patent No.: US 9,507,888 B1
(45) Date of Patent: Nov. 29, 2016

(54) ACTIVE STATE VISUALIZATION FOR FINITE STATE MACHINE MODELS

(71) Applicant: THE MATHWORKS, INC., Natick, MA (US)

(72) Inventors: Nishith Aggarwal, Chicago, IL (US); Srinath Avadhanula, Waltham, MA (US); Vijaya Raghavan, Brookline, MA (US); David B. Andrade, Brookline, MA (US)

(73) Assignee: The MathWorks, Inc., Natick, MA (US)

( * ) Notice: Subject to any disclaimer, the term of this patent is extended or adjusted under 35 U.S.C. 154(b) by 901 days.

(21) Appl. No.: 13/834,917

(22) Filed: Mar. 15, 2013

Related U.S. Application Data

(60) Provisional application No. 61/656,061, filed on Jun. 6, 2012.

(51) Int. Cl.
*G06G 7/62* (2006.01)
*G06F 17/50* (2006.01)
*G06F 9/44* (2006.01)

(52) U.S. Cl.
CPC ........... *G06F 17/5009* (2013.01); *G06F 9/444* (2013.01)

(58) Field of Classification Search
CPC .................................................... G06F 9/444
USPC ........................................................ 703/17
See application file for complete search history.

(56) References Cited

U.S. PATENT DOCUMENTS 7,500,209 B2 * 3/2009 Raghavan ............... G06F 8/10
716/106

OTHER PUBLICATIONS

Stateflow & Stateflow Coder for Complex Logic and State Diagram Modeling; user's guide, Mathworks; 2003; 896 pp.*

\* cited by examiner

*Primary Examiner* — Hugh Jones
(74) *Attorney, Agent, or Firm* — Harrity & Harrity, LLP

(57) ABSTRACT

A device receives information that identifies a model, of a finite state machine, that includes information that identifies a parent state and sub-states of the parent state. The device generates a data structure that designates an enumerated data type associated with the parent state, where the enumerated data type includes values corresponding to the sub-states. The device executes the model, based on the data structure, and monitors operation of the finite state machine and state transitions among some of the sub-states. The device detects, based on the state transitions, a change in an active sub-state that represents a particular sub-state, of the sub-states, that is active at a particular time during execution of the model. The device provides state transition information that identifies changes in the active sub-state over time.

20 Claims, 15 Drawing Sheets

US 9,507,888 B1

ACTIVE STATE VISUALIZATION FOR FINITE STATE MACHINE MODELS

RELATED APPLICATION

This application claims priority under 35 U.S.C. §119 based on U.S. Provisional Patent Application No. 61/656,061, filed on Jun. 6, 2012, the content of which is incorporated by reference herein in its entirety.

DETAILED DESCRIPTION

The following detailed description of example implementations refers to the accompanying drawings. The same reference numbers in different drawings may identify the same or similar elements.

A finite state machine may refer to a system that may be in one of a finite number of states at any given time, and may transition between states based on the occurrence of an event. The state of the finite state machine at a given point in time (e.g., a current time) may be referred to as an active state of the finite state machine. The states of a finite state machine may be hierarchical, where a parent state is considered active when any of the child states of the parent state are active.

A user (e.g., a system designer) may model a finite state machine using modeling software, and may execute the model to simulate and/or monitor operation of the finite state machine. The user may want to quickly determine the active state of the finite state machine, or other information associated with the active state, based on the simulation. Such a determination may be difficult when the user must manually track changes to the active state. Implementations described herein may provide information associated with the active state of a finite state machine in a visual manner that is easy to interpret.

Figure 1:
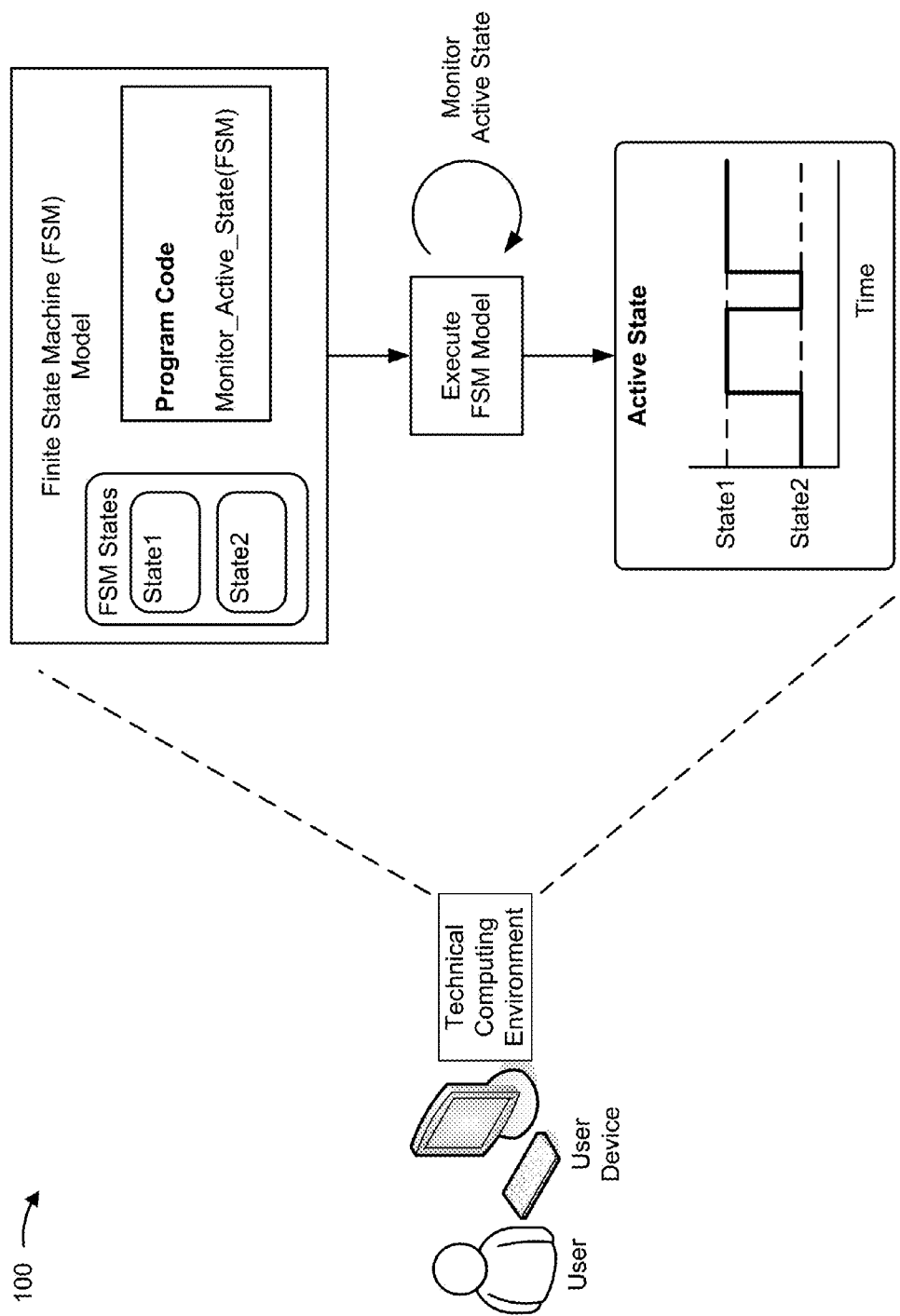
FIG. 1 is a diagram of an overview of an example implementation described herein.

FIG. 1 is a diagram of an overview of an example implementation 100 described herein. As shown in FIG. 1, implementation 100 may include a user interacting with a technical computing environment (TCE) of a user device. The user device may receive a finite state machine (FSM) model, which may include a block diagram model, a flow chart, and/or program code that describes the finite state machine. For example, the user may interact with the user device to create and/or load the FSM model.

As further shown in FIG. 1, the user device may execute the FSM model, such as by executing program code that causes the user device to simulate the FSM model. The user device may monitor an active state of the FSM model during model execution, and may provide a visual representation of changes in the active state over time. In some implementations, the user may interact with the provided visual representation and/or the FSM model (e.g., via a user interface), and the user device may provide other information associated with the FSM model, based on the user interaction.

Figure 2:
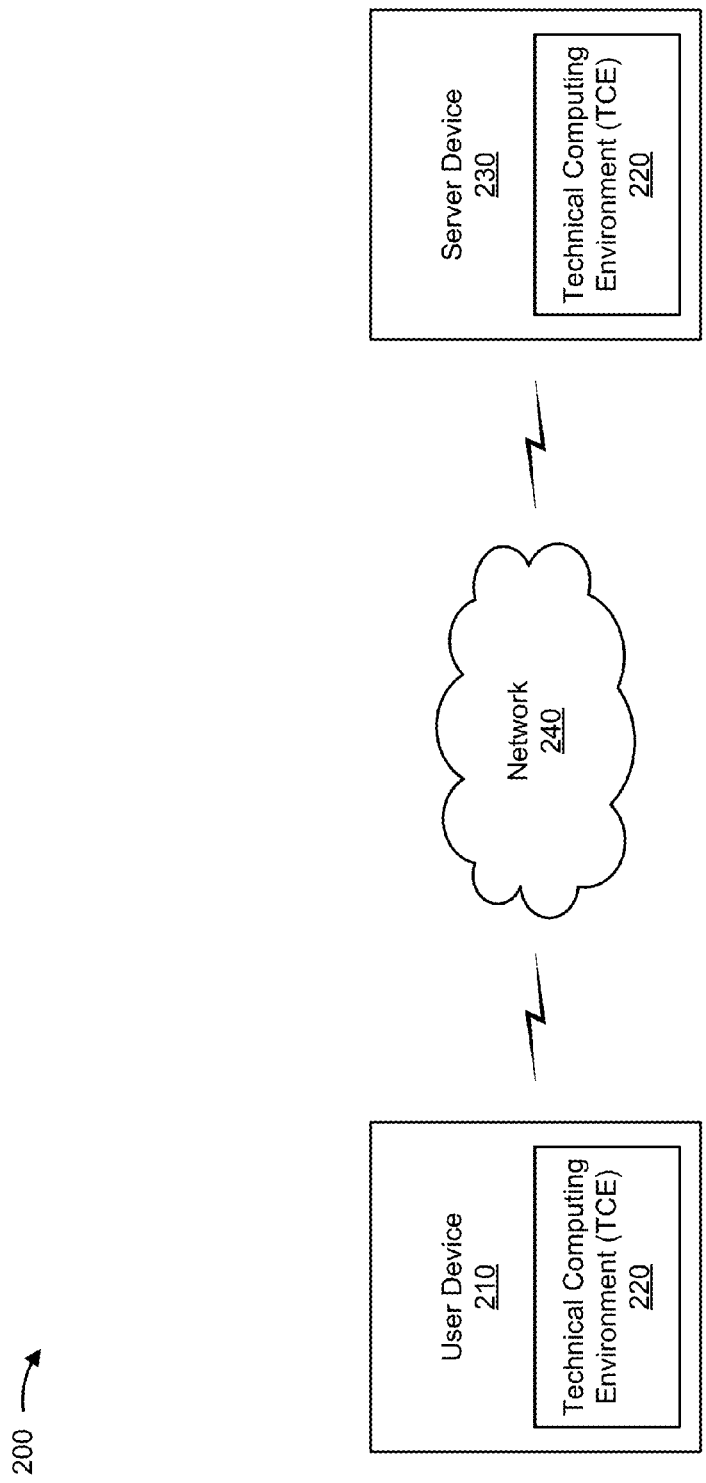
FIG. 2 is a diagram of an example environment in which systems and/or methods described herein may be implemented.

FIG. 2 is a diagram of an example environment 200 in which systems and/or methods described herein may be implemented. As shown in FIG. 2, environment 200 may include a user device 210, which may include a technical computing environment (TCE) 220. Furthermore, environment 200 may include a server device 230, which may include TCE 220, and a network 240. Devices of environment 200 may interconnect via wired connections, wireless connections, or a combination of wired and wireless connections.

User device 210 may include a device capable of receiving, creating, processing, and/or providing information associated with a model, such as a finite state machine model. For example, user device 210 may include a computing device (e.g., a desktop computer, a laptop computer, a tablet computer, a handheld computer, a server, etc.), a mobile phone (e.g., a smart phone, a radiotelephone, etc.), or a similar device. In some implementations, user device 210 may receive information from and/or transmit information to server device 230 (e.g., information associated with a finite state machine model).

User device 210 may host TCE 220. TCE 220 may include any hardware-based logic or a combination of hardware and software-based logic that provides a computing environment that allows tasks to be performed (e.g., by users) related to disciplines, such as, but not limited to, mathematics, science, engineering, medicine, and business. TCE 220 may include a text-based environment (e.g., MATLAB® software), a graphically-based environment (e.g., Simulink® software, Stateflow® software, SimEvents® software, etc., by The MathWorks, Inc.; VisSim by Visual Solutions; LabView® by National Instruments; StateWORKS Studio by StateWORKS, etc.), or another type of environment, such as a hybrid environment that may include, for example, a text-based environment and a graphically-based environment.

TCE 220 may include a modeling system that may be used in the creation of a functional model and that may enable generation of executable code based on the model. For example, TCE 220 may include a graphical modeling tool or application that provides a user interface for a numerical computing environment. Additionally, or alternatively, TCE 220 may include a graphical modeling tool and/or application that provides a user interface for modeling and simulating (e.g., by executing a model) a dynamic system (e.g., based on differential equations, difference equations, algebraic equations, discrete events, discrete states, stochastic relations, etc.). A dynamic system (either natural or man-made) may be a system whose response at any given time may be a function of its input stimuli, its current state, and a current time.

The system represented by a model may have various execution semantics that may be represented in the model as a collection of modeling entities, often referred to as blocks. A block may generally refer to a portion of functionality that may be used in the model. The block may be represented graphically, textually, and/or stored in some form of internal representation. Also, a particular visual depiction used to represent the block, for example in a graphical block diagram, may be a design choice. A block may be hierarchical in that the block itself may comprise one or more blocks that make up the block.

A graphical model (e.g., a functional model) may include entities with relationships between the entities, and the relationships and/or the entities may have attributes associated with them. The entities my include model elements, such as blocks and/or ports. The relationships may include model elements, such as lines (e.g., connector lines) and references. The attributes may include model elements, such as value information and meta information for the model element associated with the attributes. A graphical model may be associated with configuration information. The configuration information may include information for the graphical model, such as model execution information (e.g., numerical integration schemes, fundamental execution period, etc.), model diagnostic information (e.g., whether an algebraic loop should be considered an error or result in a warning), model optimization information (e.g., whether model elements should share memory during execution), model processing information (e.g., whether common functionality should be shared in code that is generated for a model), etc.

Additionally, or alternatively, a graphical model may have executable semantics and/or may be executable. An executable graphical model may be a time based block diagram. A time based block diagram may consist, for example, of blocks connected by lines (e.g., connector lines). The blocks may consist of elemental dynamic systems such as a differential equation system (e.g., to specify continuous-time behavior), a difference equation system (e.g., to specify discrete-time behavior), an algebraic equation system (e.g., to specify constraints), a state transition system (e.g., to specify finite state machine behavior), an event based system (e.g., to specify discrete event behavior), etc. The lines may represent signals (e.g., to specify input/output relations between blocks or to specify execution dependencies between blocks), variables (e.g., to specify information shared between blocks), physical connections (e.g., to specify electrical wires, pipes with volume flow, rigid mechanical connections, etc.), etc. The attributes may consist of meta information such as sample times, dimensions, complexity (whether there is an imaginary component to a value), data type, etc. associated with the model elements.

In a time based block diagram, ports may be associated with blocks. A relationship between two ports may be created by connecting a line (e.g., a connector line) between the two ports. Lines may also, or alternatively, be connected to other lines, for example by creating branch points. For instance, three or more ports can be connected by connecting a line to each of the ports, and by connecting each of the lines to a common branch point for all of the lines. A common branch point for the lines that represent physical connections may be a dynamic system (e.g., by summing all variables of a certain type to 0 or by equating all variables of a certain type). A port may be an input port, an output port, an enable port, a trigger port, a function-call port, a publish port, a subscribe port, an exception port, an error port, a physics port, an entity flow port, a data flow port, a control flow port, etc.

Relationships between blocks may be causal and/or non-causal. For example, a model (e.g., a functional model) may include a block that represents a continuous-time integration block that may be causally related to a data logging block by using a line (e.g., a connector line) to connect an output port of the continuous-time integration block to an input port of the data logging block. Further, during execution of the model, the value stored by the continuous-time integrator may change as the current time of the execution progresses. The value of the state of the continuous-time integrator may be available on the output port and the connection with the input port of the data logging block may make this value available to the data logging block.

As another example, TCE 220 may include a state machine model (e.g., a graphical state machine model). The state machine model may include an executable time-based model. The state machine model may include a discrete-state transition system that evaluates transitions at particular points in time. The points in time may be based on a periodic and/or discrete sample time, or the points in time may be based on a change of a truth value of an expression (e.g., an inequality). An evaluation of the transition system may be associated with the occurrence of an event, and the evaluation may consist of determining whether a transition out of a state is enabled. A transition may be enabled when associated event(s) occur and when associated condition(s) are satisfied. The state transition system may include input and output variables that may be obtained from and/or provided to graphical entities in a graphical model (e.g., the state machine model). The graphical entities may represent time-based dynamic systems, such as differential equation systems. In some embodiments, the graphical model and the graphical entities may represent a multi-domain dynamic system. The domains may include execution domains such as, for example, continuous time, discrete time, discrete event, state transition system, and/or a model of computation. The model of computation may be based on differential equations, difference equations, algebraic equations, discrete events, discrete states, stochastic relations, data flows, synchronous data flows, control flows, process networks, and/or state machines.

Server device 230 may include one or more devices capable of receiving, storing, processing, and/or transmitting information associated with a model, such as a finite state machine model. For example, server device 230 may include a computing device, such as a server, a desktop computer, a laptop computer, a tablet computer, a handheld computer, or a similar device. In some implementations, server device 230 may host TCE 220.

Network 240 may include one or more wired and/or wireless networks. For example, network 240 may include a cellular network, a public land mobile network ("PLMN"), a local area network ("LAN"), a wide area network ("WAN"), a metropolitan area network ("MAN"), a telephone network (e.g., the Public Switched Telephone Network ("PSTN")), an ad hoc network, an intranet, the Internet, a fiber optic-based network, and/or a combination of these or other types of networks.

The number of devices and/or networks shown in FIG. 2 is provided as an example. In practice, there may be additional, fewer, different, or differently arranged devices and/or networks than those shown in FIG. 2. Furthermore, two or more devices shown in FIG. 2 may be implemented within a single device, or a single device shown in FIG. 2 may be implemented as multiple, distributed devices. Additionally, one or more of the devices of environment 200 may perform one or more functions described as being performed by another one or more devices of environment 200.

Figure 3:
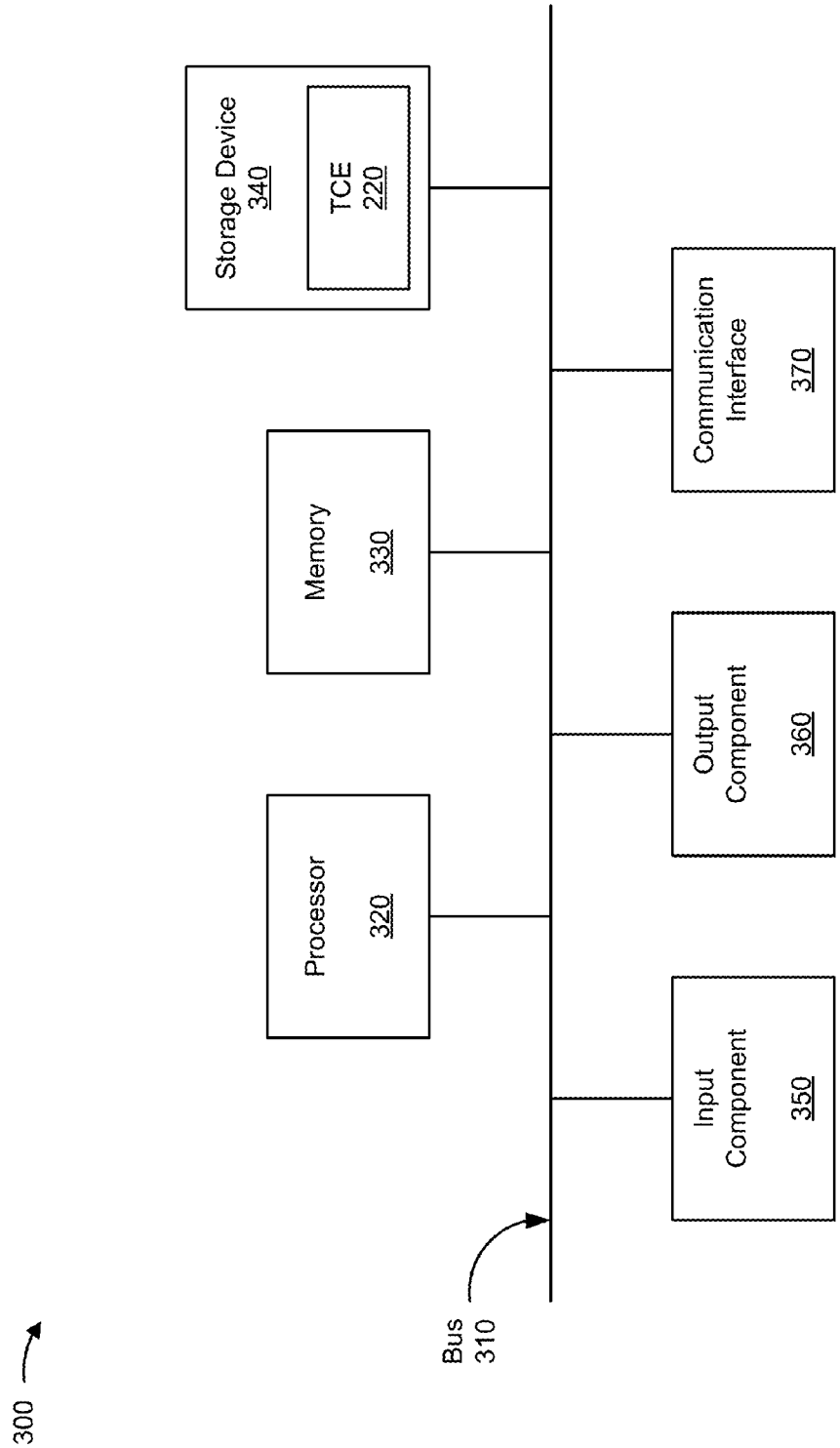
FIG. 3 is a diagram of example components of one or more devices of FIG. 2.

FIG. 3 is a diagram of example components of a device 300, which may correspond to user device 210 and/or server device 230. In some implementations, each of user device 210 and/or server device 230 may include one or more devices 300 and/or one or more components of device 300. As shown in FIG. 3, device 300 may include a bus 310, a processor 320, a memory 330, a storage device 340, an input component 350, an output component 360, and a communication interface 370.

Bus 310 may include a path that permits communication among the components of device 300. Processor 320 may include a processor (e.g., a central processing unit, a graphics processing unit, an accelerated processing unit, etc.), a microprocessor, and/or any processing logic (e.g., a field-programmable gate array (FPGA), an application-specific integrated circuit (ASIC), etc.) that interprets and/or executes instructions. Memory 330 may include a random access memory (RAM), a read only memory (ROM), and/or another type of dynamic or static storage device (e.g., a flash, magnetic, or optical memory) that stores information and/or instructions for use by processor 320.

Storage device 340 may store information and/or software related to the operation and use of device 300. For example, storage device 340 may include a hard disk (e.g., a magnetic disk, an optical disk, a magneto-optic disk, a solid state disk, etc.), a compact disc (CD), a digital versatile disc (DVD), a floppy disk, a cartridge, a magnetic tape, and/or another type of computer-readable medium, along with a corresponding drive. In some implementations, storage device 340 may store TCE 220.

Input component 350 may include a component that permits a user to input information to device 300 (e.g., a touch screen display, a keyboard, a keypad, a mouse, a button, a switch, etc.). Output component 360 may include a component that outputs information from device 300 (e.g., a display, a speaker, one or more light-emitting diodes (LEDs), etc.).

Communication interface 370 may include a transceiver-like component, such as a transceiver and/or a separate receiver and transmitter, that enables device 300 to communicate with other devices, such as via a wired connection, a wireless connection, or a combination of wired and wireless connections. For example, communication interface 370 may include an Ethernet interface, an optical interface, a coaxial interface, an infrared interface, a radio frequency (RF) interface, a universal serial bus (USB) interface, or the like.

Device 300 may perform various operations described herein. Device 300 may perform these operations in response to processor 320 executing software instructions included in a computer-readable medium, such as memory 330 and/or storage device 340. A computer-readable medium may be defined as a non-transitory memory device. A memory device may include memory space within a single physical storage device or memory space spread across multiple physical storage devices.

Software instructions may be read into memory 330 and/or storage device 340 from another computer-readable medium or from another device via communication interface 370. When executed, software instructions stored in memory 330 and/or storage device 340 may cause processor 320 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number of components shown in FIG. 3 is provided as an example. In practice, device 300 may include additional, fewer, different, or differently arranged components than those shown in FIG. 3. Additionally, or alternatively, one or more components of device 300 may perform one or more functions described as being performed by another one or more components of device 300.

Figure 4:
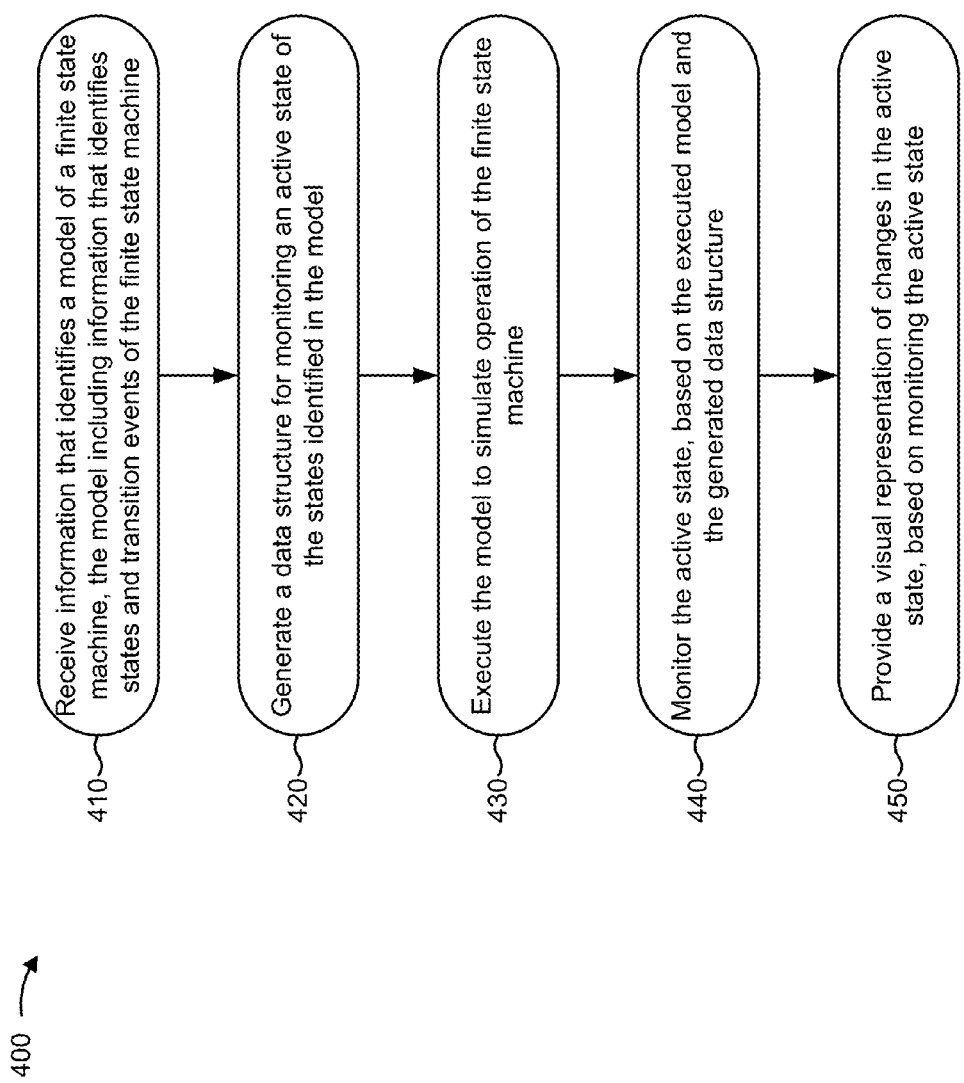
FIG. 4 is a flow chart of an example process for providing a visual representation of active states of a finite state machine model.

FIG. 4 is a flow chart of an example process 400 for providing a visual representation of active states of a finite state machine model. In some implementations, one or more process blocks of FIG. 4 may be performed by user device 210. In some implementations, one or more process blocks of FIG. 4 may be performed by another device or a group of devices separate from or including user device 210, such as server device 230.

As shown in FIG. 4, process 400 may include receiving information that identifies a model of a finite state machine, the model including information that identifies states and transition events of the finite state machine (block 410). For example, user device 210 may receive information that identifies the model of the finite state machine from a user and/or from another device (e.g., server device 230). In some implementations, the user may interact with user device 210 (e.g., via TCE 220) to create, edit, and/or load the FSM model. The FSM model may include, for example, a block diagram model, a mathematical model, a flow chart, and/or program code that describes the FSM model.

A finite state machine may refer to a system that may be in one of a finite number of states at any given time, and may transition between states based on the occurrence of an event. A state may refer to a status of a system that is waiting to execute a transition to another state. The FSM model may describe one or more possible states (e.g., all possible states) of the finite state machine, and may also describe events that trigger a transition from one state to another state (e.g., transition events that trigger a state transition). For example, an event may be triggered when a set of conditions is met. Additionally, or alternatively, a transition between states may be triggered based on the occurrence of an event and/or a set of conditions being satisfied. In some implementations, the FSM model may include a state transition table that identifies a state to which the FSM will transition, based on the current state (e.g., the active state) and another input (e.g., an event, a condition, etc.). The current state, or the state of the finite state machine at a particular time, may be referred to as the active state.

The FSM model may describe a hierarchy of states of the finite state machine. For example, the hierarchy of states may include parent states and sub-states of the parent states. Each parent state may have multiple sub-states, and each sub-state may have a single parent state. A sub-state may be a child state of a parent state. The child state may be directly associated (e.g., linked) to the parent state, with no intervening states.

Additionally, or alternatively, the hierarchy of states may include one or more top-level or first-level states (e.g., states with no parent state), one or more second-level states (e.g., child states of the first-level states), one or more third-level states (e.g., child states of the second-level states), etc. A sub-state of a higher-level state may include any lower-level state that depends on the higher-level state. A bottom-level state may refer to a state with no child states (e.g., a state that is not a parent state), and may be referred to herein as a leaf state. A parent state of the FSM model may be considered an active state when any sub-state (e.g., a child state, a grandchild state, etc.) of the parent state is an active state of the FSM model.

In some implementations, the states at a particular level in the hierarchy of states may be mutually exclusive. In other words, only one state at the particular level may be an active state at a particular time. For example, only one top-level state may be active at a particular time. As another example, if a parent state has three child states, only one of the three child states may be active at a particular time. However, the parent state and one of the child states may both be active at the same time because of the hierarchy of states.

As shown in FIG. 4, process 400 may include generating a data structure for monitoring an active state of the states identified in the model (block 420). For example, user device 210 may generate the data structure based on user input and/or information received from another device (e.g., server device 230). In some implementations, the data structure may include program code. The program code may cause user device 210 to monitor, store, and/or provide information associated with active states of the FSM model. For example, the program code may cause user device 210 to monitor one or more active states and/or state transitions of the FSM model while the FSM model is being executed. In some implementations, user device 210 may automatically generate the program code (e.g., without user interaction). Additionally, or alternatively, user device 210 may receive the program code (e.g., via user input and/or from another device). Additionally, or alternatively, the data structure may include a data structure capable of being read by program code. For example, user device 210 may execute the FSM model using general purpose execution program code that access information stored in the data structure (e.g., using interpreted simulation and/or interpreted execution).

In some implementations, user device 210 may create an enumerated data type for a parent state in the FSM model. The enumerated data type for a particular parent state may include a set of values (e.g., literals or constants) corresponding to the child states of the parent state. In some implementations, the enumerated data type for a parent state may also include an additional value to indicate that none of the child states are active (e.g., None, as shown in the example program code below). As an example, assume that a parent state, named Parent, has three child states named Child1, Child2, and Child3. User device 210 may generate program code to monitor the active child state of the parent state as follows:

```
classdef Parent<TCE.IntEnumType
    enumeration
        None(0)
        Child1(1)
        Child2(2)
        Child3(3)
    end
end.
```

Additionally, or alternatively, user device 210 may generate a data structure that includes an identification of the parent state (e.g., Parent), the child states (e.g., Child1(1), Child2(2), and Child3(3)), and/or an identifier indicating that none of the child states are active (e.g., None(0)). The data structure may be read by the program code, when user device 210 executes the program code. In some implementations, user device 210 may input the data structure into a general purpose simulator that executes the FSM model. Additionally, or alternatively, user device 210 may use the data structure to generate the program code.

In some implementations, an order in which the child states are defined within the enumerated date type may affect a manner in which the child states are depicted on a visual representation provided by user device 210. For example, a child state that is defined first (e.g., None) may appear at the bottom of a graph that provides active state information, and a child state that is defined last (e.g., Child3) may appear at the top of the graph.

When creating the enumerated data type, user device 210 may order the child states based on an order in which the child states become active during execution of the finite state machine model. Additionally, or alternatively, user device 210 may receive information that specifies an order in which the child states are to be defined in the enumerated data type. For example, a user may specify the order, such as by creating a state transition table associated with the FSM model.

Additionally, or alternatively, user device 210 may order the child states based on connections between states (e.g., connections identified in the model), a quantity of connections and/or state transitions associated with a state (e.g., a state with a higher quantity may be placed before a state with a lower quantity), a transition logic or flow logic identified in the model, a default transition flow graph identified in the model, a distance between a state and an initial and/or default state (e.g., a quantity of states between the state and the default/initial state), a layout of the model (e.g., in a block diagram model, where, for example, states laid out on the left or the top of the layout are ordered before states laid out on the right or the bottom of the layout), etc.

Additionally, or alternatively, user device 210 may order child states based on a duration that the child states are active during model execution. For example, user device 210 may test the model (e.g., execute the model using a test suite), and may determine a length of time, during testing, that each child state is active. User device 210 may order the child states with the child state that is active for the longest period of time being ordered first, a child state that is active for the second-longest period of time being ordered second, etc. In another implementation, user device 210 may order child states based on a frequency that the child states become active during model execution. For example, user device 210 may test the model (e.g., execute the model using a test suite), and may determine a frequency, during testing, that each child state becomes active. User device 210 may order the child states with the child state that becomes active most often being ordered first, a child state that becomes active second most often being ordered second, etc.

In some implementations, user device 210 may define child states of the same parent state in sequential order. In some implementations, user device 210 may store information that identifies the order of the child states, and may reuse the stored information to determine the order of the child states in future executions of the FSM model.

As shown in FIG. 4, process 400 may include executing the model to simulate operation of the finite state machine (block 430), and monitoring the active state, based on the executed model and the generated data structure (block 440). For example, user device 210 may execute the model by executing program code associated with the model. In some implementations, the executed program code may include the generated program code for monitoring the active state.

Additionally, or alternatively, the program code for monitoring the active state may be generated during execution of the model (and may also be executed during execution of the model). For example, user device 210 may create enumerated data types for parent states of the model, and may order the enumerated data types based on an order in which the parent states are activated (e.g., become the active state) during model execution. Additionally, or alternatively, user device 210 may order the child states, identified by values included in an enumerated data type, based on an order in which the child states are activated (e.g., become the active state) during model execution.

User device 210 may monitor the active state during model execution. For example, user device 210 may store information that identifies a state transition (e.g., a state transition identifier), a state from which the FSM model is transitioning (e.g., an old state that is active at a time immediately preceding the state transition), a state to which the FSM model is transitioning (e.g., a new state that is active at a time immediately following the state transition), and a time at which the state transition occurred (e.g., an actual time, a simulated time, a time since a start of model execution, etc.). Additionally, or alternatively, user device 210 may store information that identifies a time period and an active state of the FSM model during the time period (e.g., an indication of which state or states are active during the time period, based on model execution). User device 210 may store the information during and/or after model execution.

In some implementations, user device 210 may monitor state transitions, and may store information associated with each state transition. Additionally, or alternatively, user device 210 may receive an indication of one or more states to monitor, and may store information associated with the indicated states. For example, user device 210 may store information associated with state transitions to and/or from the indicated states.

As shown in FIG. 4, process 400 may include providing a visual representation of changes in the active state, based on monitoring the active state (block 450). For example, user device 210 may provide, via a user interface, a visual representation of changes in the active state (e.g., state transitions) during a series of state changes and/or over time. The visual representation may provide an indication of which state of the FSM model is the active state at a particular time and/or over a particular period of time. For example, the visual representation may include a graph with time represented on a first axis (e.g., the x axis) and the states of the FSM model on a second axis (e.g., the y axis). Additionally, or alternatively, the visual representation may include a graph with a series of state changes represented on the first axis, and the states of the FSM model on the second axis. In some implementations, time may be represented as an actual time (e.g., based on a clock associated with user device 210), a simulated time, a time since a start of model execution, an event number, a state transition number (e.g., a first state transition, a second state transition, etc.), or the like. In some implementations, the user may expand or collapse time and/or events on the x axis. For example, if multiple state transitions happen at the same point in time, the user may expand the x-axis to view the multiple transitions, or may collapse the x-axis to view only the input state (e.g., immediately preceding the point in time), and the output state (e.g., immediately following the point in time).

User device 210 may provide the visual representation during model execution (e.g., as the model is being executed), in some implementations. Additionally, or alternatively, user device 210 may provide the visual representation after the model has been executed (e.g., upon completion of model execution). Additionally, or alternatively, user device 210 may provide the visual representation based on stored information (e.g., a state transition identifier, an old state, a new state, a time, etc.). In some implementations, user device 210 may provide the visual representation based on receiving user input.

In some implementations, user device 210 may receive an indication of user interaction with the visual representation, and may modify a manner in which the visual representation is provided based on the user interaction. For example, a user may modify an orientation of the visual representation, a manner in which time is represented by the visual representation, a manner in which states are represented by the visual representation (e.g., the user may modify the states that are represented, an order of the states that are represented, etc.), and/or other characteristics of the visual representation.

User device 210 may provide (e.g., via the visual representation) information associated with one or more states provided on the visual representation, in some implementations. For example, user device 210 may provide information that identifies a quantity of times a transition into and/or out of a state occurred during model execution, an amount of time that a state was active during model execution, an amount of time that a state was active between a transition into and a transition out of the state, an event that occurred at a state transition and/or that caused the state transition, a value of a signal associated with the model at a particular time and/or at a particular state transition, a message between different FSM models, etc.

In some implementations, user device 210 may provide the information based on a breakpoint. A user may interact with the visual representation to insert a breakpoint at a particular time represented on the visual representation. The breakpoint may be used, for example, for debugging. The user may play back the simulation, and user device 210 may simulate the model until the breakpoint is reached. When the breakpoint is reached, user device 210 may provide information associated with the model, a state (e.g., an active state), an event, a state transition, etc. associated with the particular time identified by the breakpoint.

In some implementations, information associated with the active states and/or the state transitions (e.g., with respect to time) may be stored, and/or may be used as an input to an element (e.g., a block) of the FSM model and/or another model. For example, events in the other model may be based on whether or not a particular state is active at a particular time, which may be identified in the information provided to the other model. Additionally, or alternatively, information associated with the active states and/or the state transitions may be used to determine a behavior of the model and/or of another model.

While a series of blocks has been described with regard to FIG. 4, the blocks and/or the order of the blocks may be modified in some implementations. Additionally, or alternatively, non-dependent blocks may be performed in parallel. For example, block 420 and block 430 may be performed in parallel, or block 430 may be performed before block 420.

FIGS. 5A-5D are diagrams of an example implementation 500 relating to example process 400 (FIG. 4).

Figure 5A:
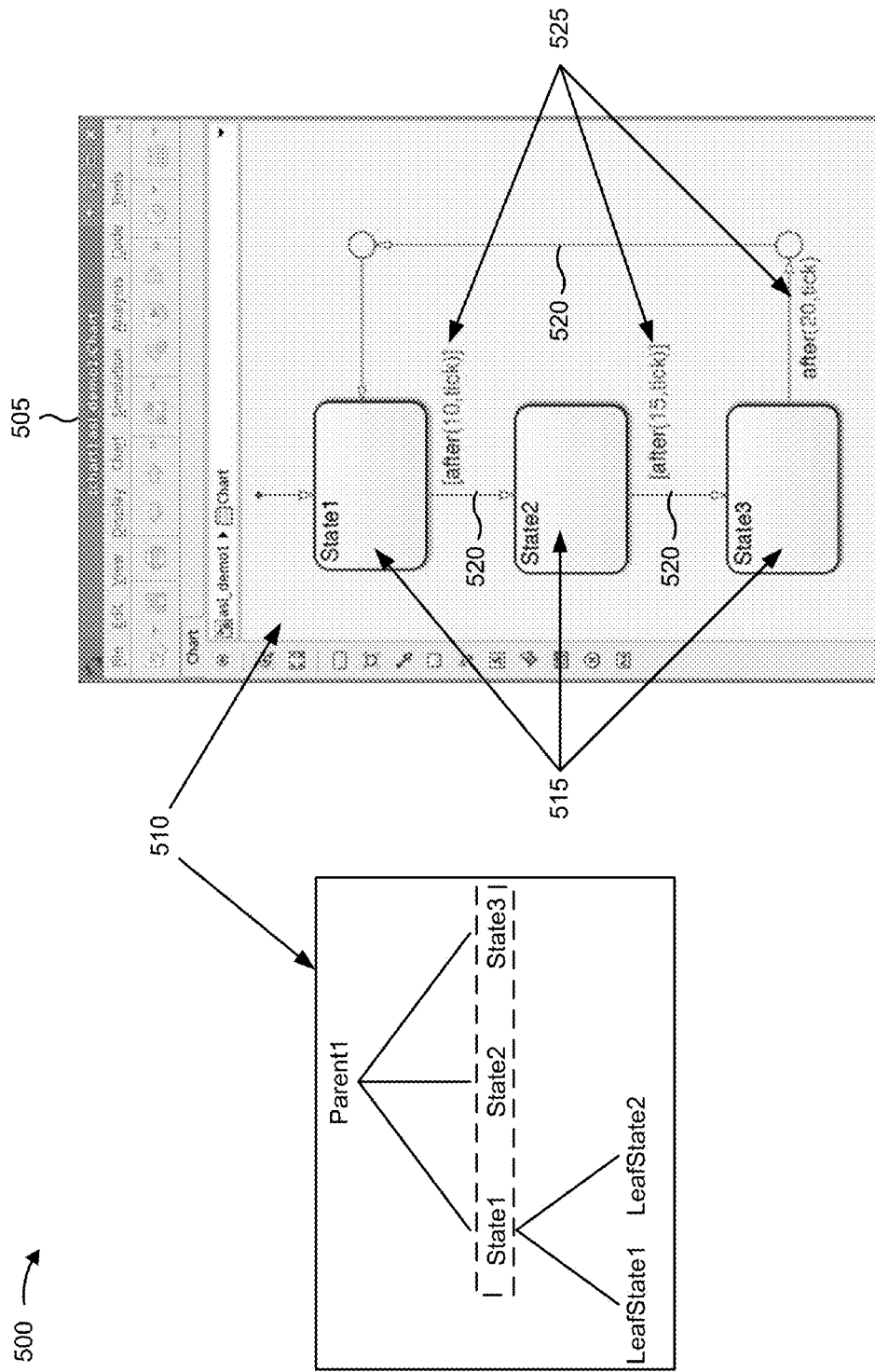
FIGS. 5A-5D are diagrams of an example implementation relating to the example process shown in FIG. 4.

As shown in FIG. 5A, user device 210 may provide a user interface 505 for a user to create, edit, and/or load a finite state machine model 510. In example implementation 500, assume that FSM model 510 includes a top-level state named Parent1, three child states of Parent1, named State1, State2, and State3, and two child states of State1, named LeafState1 and LeafState2. Further assume that the user has specified that State1, State2, and State3 are to be displayed via user interface 505, as shown. FSM model 510 may be provided via user interface 505 as a block diagram model.

In example implementation 500, assume the user has created FSM model 510 by creating blocks that represent states 515, arrows that represent state transitions 520 between states 515, and transition events 525 that cause state transitions 520 to occur. For example, the user may designate states 515 as State1, State2, and State3, and may designate state transitions 520 as State1 to State2, State2 to State3, and State3 to State1.

Assume further that the user has designated a first transition event 525 that causes state transition 520 from State1 to State2 as the passage of 1 second (e.g., from the time FSM model 510 enters or transitions to State1), via the program code [after(10,tick)] (e.g., where 10 represents a quantity of clock ticks, and where each clock tick is one-tenth ($\frac{1}{10}$) of a second). Similarly, assume that the user has designated a second transition event 525 that causes state transition 520 from State2 to State3 as the passage of 1.5 seconds (e.g., from the time FSM model 510 enters or transitions to State2), via the program code [after(15,tick)]. Finally, assume that the user has designated a third transition event 525 that causes state transition 520 from State3 to State1 as the passage of 2 seconds (e.g., from the time FSM model 510 enters or transitions to State3), via the program code [after (20,tick)].

In some implementations, user interface 505 may provide an input mechanism (e.g., a button, a right-click menu, a menu item, a link, etc.) for a user to edit properties associated with FSM model 510. For example, the user may want user device 210 to monitor active states of FSM model 510, and to provide a visual representation of the active states over time.

Figure 5B:
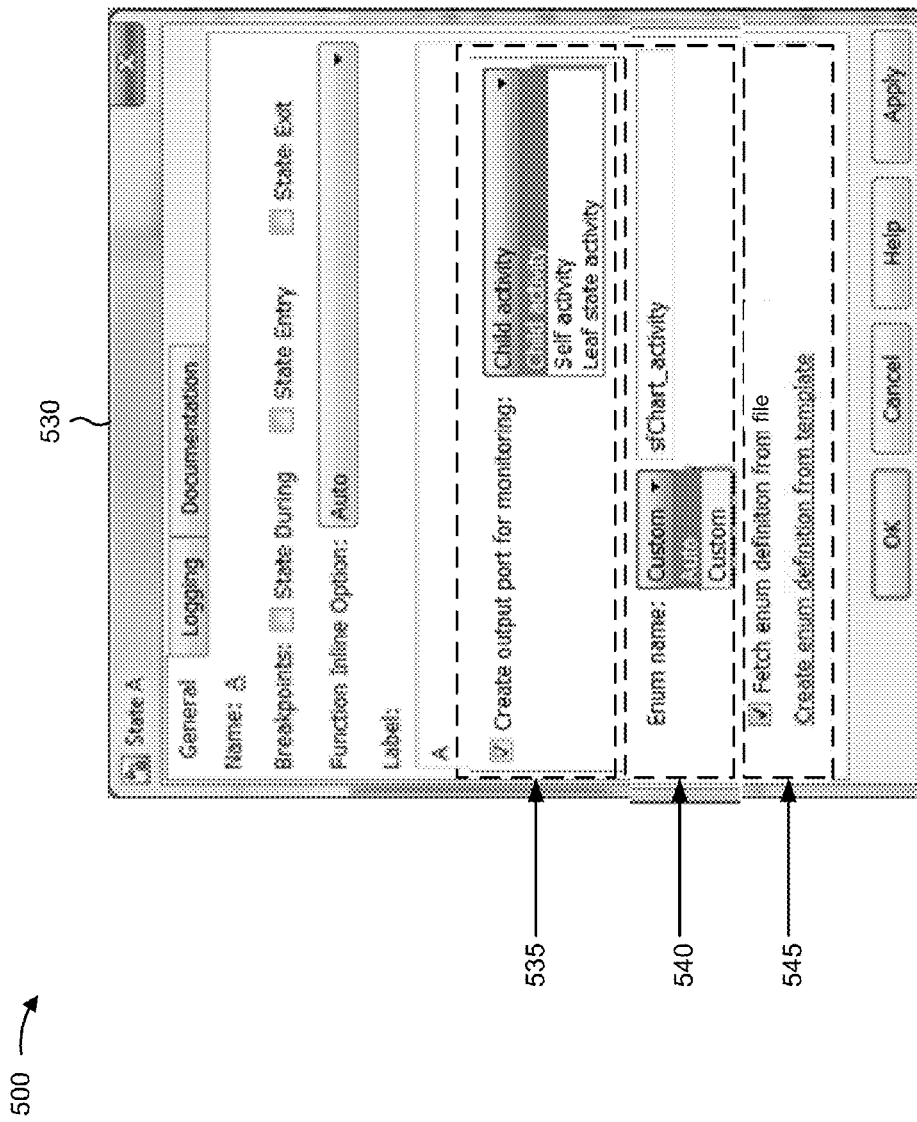

As shown in FIG. 5B, user device 210 may provide a user interface 530 for a user to specify options associated with FSM model 510. User interface 530 may be provided by user device 210 based on user interaction with user interface 505 (FIG. 5A). For example, a user may select a state 515, and may further select an input option to edit properties of the selected state, which may cause user device 210 to provide user interface 530. In some implementations, the user may edit properties for a single state 515 via user interface 530. Alternatively, the user may edit properties for a subset of states 515 in FSM model 510, or for all states 515 in FSM model 510, via user interface 530.

As further shown in FIG. 5B, user interface 530 may provide an input mechanism 535 (e.g., a checkbox, a drop-down box, etc.) for a user to provide an indication that causes user device 210 to monitor active states of FSM model 510 during model execution. For example, the user may check a box (e.g., "Create output port for monitoring") that provides the indication.

Additionally, or alternatively, the user may select an option that affects a manner in which user device 210 monitors active states and/or provides a visual representation (e.g., a report) of the active states. For example, the user may select a "Child activity" option, which may cause user device 210 to monitor and/or report an active child state of a parent state represented by user interface 530 (e.g., a parent state editable via user interface 530). Alternatively, the user may select a "Self activity" option, which may cause user device 210 to monitor and/or report an indication of whether the parent state, editable via user interface 530, is active or not (e.g., without providing information as to which child state of the parent state is active). As another alternative, the user may select a "Leaf state activity" option, which may cause user device to monitor and/or report an indication of an active bottom-level state (e.g., an active grandchild state with no child states) of a specified parent state (e.g., the parent state editable via user interface 530).

In example implementation 500, assume that State1, State2, and State3 are child states of a parent state named Parent1, and that State1 is a parent state of two child states, LeafState1 and LeafState2. Further assume that user interface 530 is used to edit options for the parent state Parent1. In this scenario, user selection of the "Self activity" option may cause user device 210 to monitor and/or report whether Parent1 is active or inactive. Parent1 may be considered active when any of the child states of Parent1 (e.g., State1, State2, or State3) and/or any of the grandchild states of Parent1 (e.g., LeafState1 or LeafState2) are active. In other words, Parent1 may be considered active when any sub-state of Parent1 (e.g., State1, State2, State3, LeafState1, or LeafState2) is active.

In this same scenario, user selection of the "Child activity" option may cause user device 210 to monitor and/or report which, if any, of the child states of Parent1 (e.g., State1, State2, or State3) are active. State1 may be considered active when any of the child states of State1 (e.g., LeafState1 or LeafState2) are active. Finally, user selection of the "Leaf state activity" option may cause user device 210 to monitor and/or report which, if any, of the bottom-level states of Parent1 (e.g., LeafState1, LeafState2, State2, or State3) are active. Note that when the "Leaf state activity" option is selected, user device 210 may not monitor and/or report that State1 is active because State1 is not a bottom-level state (e.g., State1 is a parent state of child states LeafState1 and LeafState2).

In some implementations, one or more of the monitoring/reporting options may be disabled. For example, when a selected state does not have any child states, user interface 530 used to edit the selected state may not permit the user to select the "Child activity" or the "Leaf state activity" options.

As further shown in FIG. 5B, user interface 530 may provide an input mechanism 540 (e.g., a checkbox, a drop-down box, a link, etc.) for a user to specify options associated with generating and/or activating program code for monitoring active states of FSM model 510. For example, the user may select an option (e.g., "Auto") to automatically generate the program code, or may select an option (e.g., "Custom") to manually generate the program code.

When the user selects the option to automatically generate the program code, user device 210 may generate the program code based on FSM model 510. For example, user device 210 may create an enumerated date type for a parent state, and may name the enumerated data type using the name of the parent state specified in FSM model 510. Additionally, or alternatively, user device 210 may create a set of values, for the enumerated date type, corresponding to the child states of the parent state. User device 210 may name the values using the names of the child states specified in FSM model 510. User device 210 may also create a value corresponding to an indication that the parent state is inactive (e.g., none of the child states are active).

User device 210 may determine an order in which the child states (and/or sub-states, grandchild states, etc.) are to be defined in the enumeration. In some implementations, user device 210 may define the child states in alphabetic, lexicographic, and/or alphanumeric order (e.g., A before B, 1 before 2, etc.). Additionally, or alternatively, user device 210 may define the child states in an order based on FSM model 510. For example, a model definition of FSM model 510 may specify an order in which the states are to be activated (e.g., reached, executed, etc.), and user device 210 may order the child states based on the model definition.

Additionally, or alternatively, FSM model 510 may include a state transition table (e.g., input by a user) that lists the child states in a particular order, and user device 210 may order the child states based on the particular order. Additionally, or alternatively, user device 210 may execute FSM model 510, may determine an order in which the child states become active during execution, and may order the child states based on the order in which the child states become active during execution. In some implementations, user device 210 may define a parent state before defining the child states of the parent state.

As an example, when the user has selected the "child activity" option, user device 210 may generate program code for the enumerated data type, based on an execution order of the states of FSM model 510, as follows:

```
classdef Parent1<TCE.IntEnumType
  enumeration
    None(0)
    State1(1)
    State2(2)
    State3(3)
  end
end.
```

As another example, when the user has selected the "leaf state activity" option, user device 210 may generate program code for the enumerated data type, based on an execution order of the states of FSM model 510, as follows:

```
classdef Parent1<TCE.IntEnumType
  enumeration
    None(0)
    LeafState1(1)
    LeafState2(2)
    State2(3)
    State3(4)
  end
end.
```

When the user selects the option to manually generate the program code, user interface 530 may provide an input mechanism 545 (e.g., a checkbox, a link, etc.) for the user to input the program code and/or specify program code to be used. For example, the user may select an option to specify a file that includes the program code for the enumerated data type (e.g., "Fetch enum definition from file"). User interface 530 may provide a mechanism for a user to specify the file. Additionally, or alternatively, the user may select an option to input the program code (e.g., "Create enum definition from template"). User interface 530 may provide a template that includes some program code, and may provide an indication of program code that the user is to specify to create the enumerated date type.

Figure 5C:
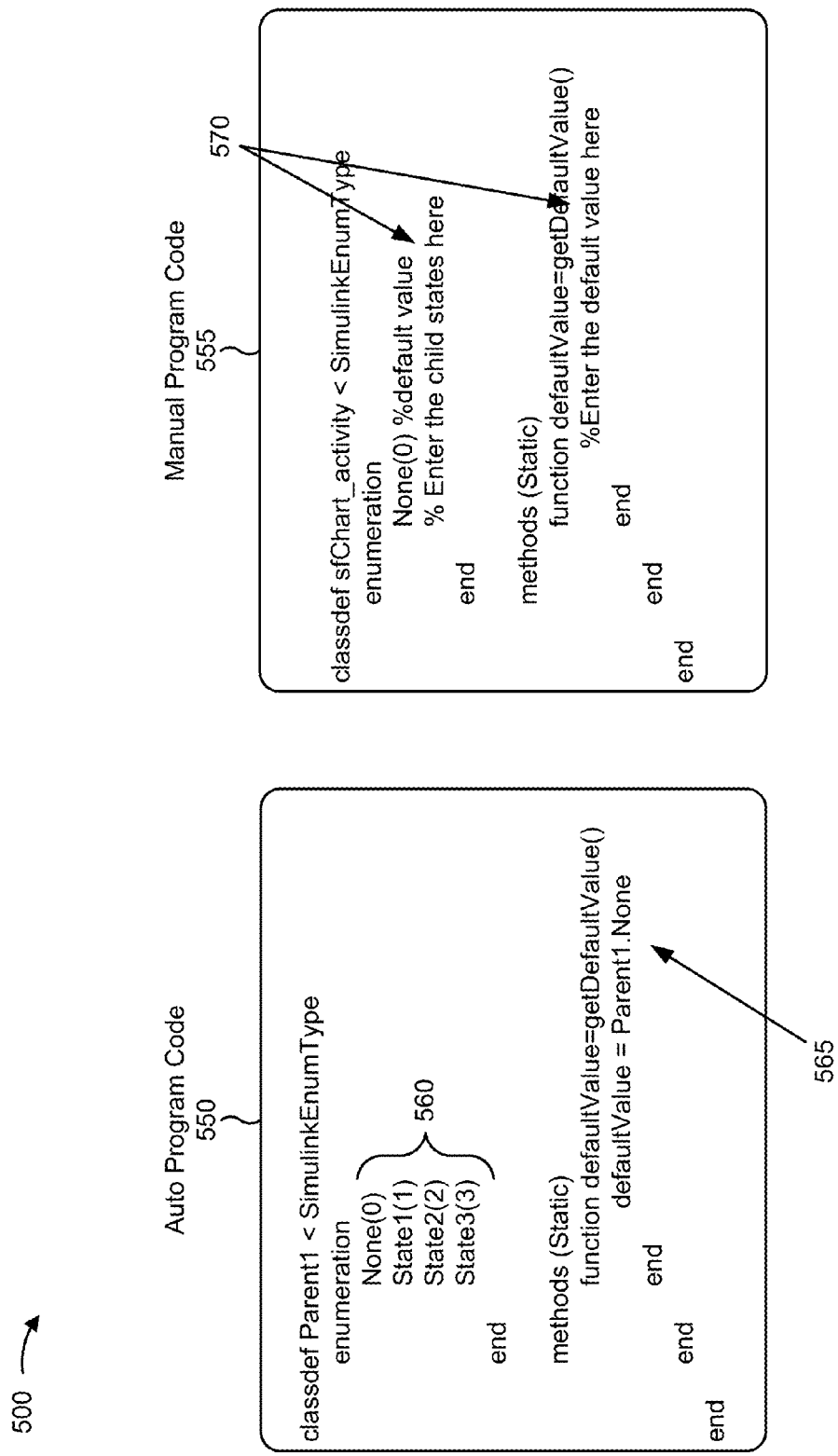

FIG. 5C shows example program code portions 550 and 555 that may be used to monitor an active child state of FSM model 510. For example, code portions 550 and 555 show an example of defining enumerated data types. Auto program code portion 550 shows example program code that may be generated when the user selects an option to automatically generate the program code. Manual program code portion 555 shows an example program code template that may be provided to and/or edited by the user.

As shown by reference number 560, auto program code portion 550 may include an ordered list of child state values of a parent state enumerated data type, as described elsewhere herein. As shown by reference number 565, auto program code portion 550 may also include program code that specifies a default (e.g., initial) value for the enumerated date type (e.g., None). The default value may be used to determine a default state of FSM model 510. As shown by reference number 570, manual program code portion 555 may provide one or more indications that guide a user in editing manual program code portion 555.

In some implementations, user device 210 may check for and/or enforce errors or restrictions in the program code. For example, user device 210 may determine a quantity of sub-states (e.g., child states, grandchild states, etc.) that should be enumerated for a particular parent state, and may require that the program code specifies an enumeration for each sub-state. Additionally, or alternatively, user device 210 may require that the program code specifies an enumeration for the case where no child states are active (e.g., the parent state is inactive). For example, user device 210 may require that a parent state with N (N≥1) child states has at least N+1 enumerations, one for each child state, and an additional enumeration to indicate that no child states are active. In some implementations, user device 210 may prompt a user (e.g., via an error notification) if the above requirements are not met.

In some implementations, the quantity of sub-states may depend on whether the user has selected a "child activity" option (e.g., which monitors only the direct child states of a parent state), a "leaf state activity" option (e.g., which monitors the leaf states of a parent state), or an "all sub-state activity" option (e.g., which monitors all sub-states of a parent state).

User device 210 may ensure that the enumeration values (e.g., literals) correspond to (e.g., are the same as) the names of the sub-states associated with the enumeration, in some implementations. Additionally, or alternatively, user device 210 may ensure that the enumeration values are all unique (e.g., no two enumeration values have the same name). If user device 210 detects an error and/or a violation of a restriction, then user device 210 may provide an indication of such error and/or violation to the user (e.g., via a user interface).

Figure 5D:
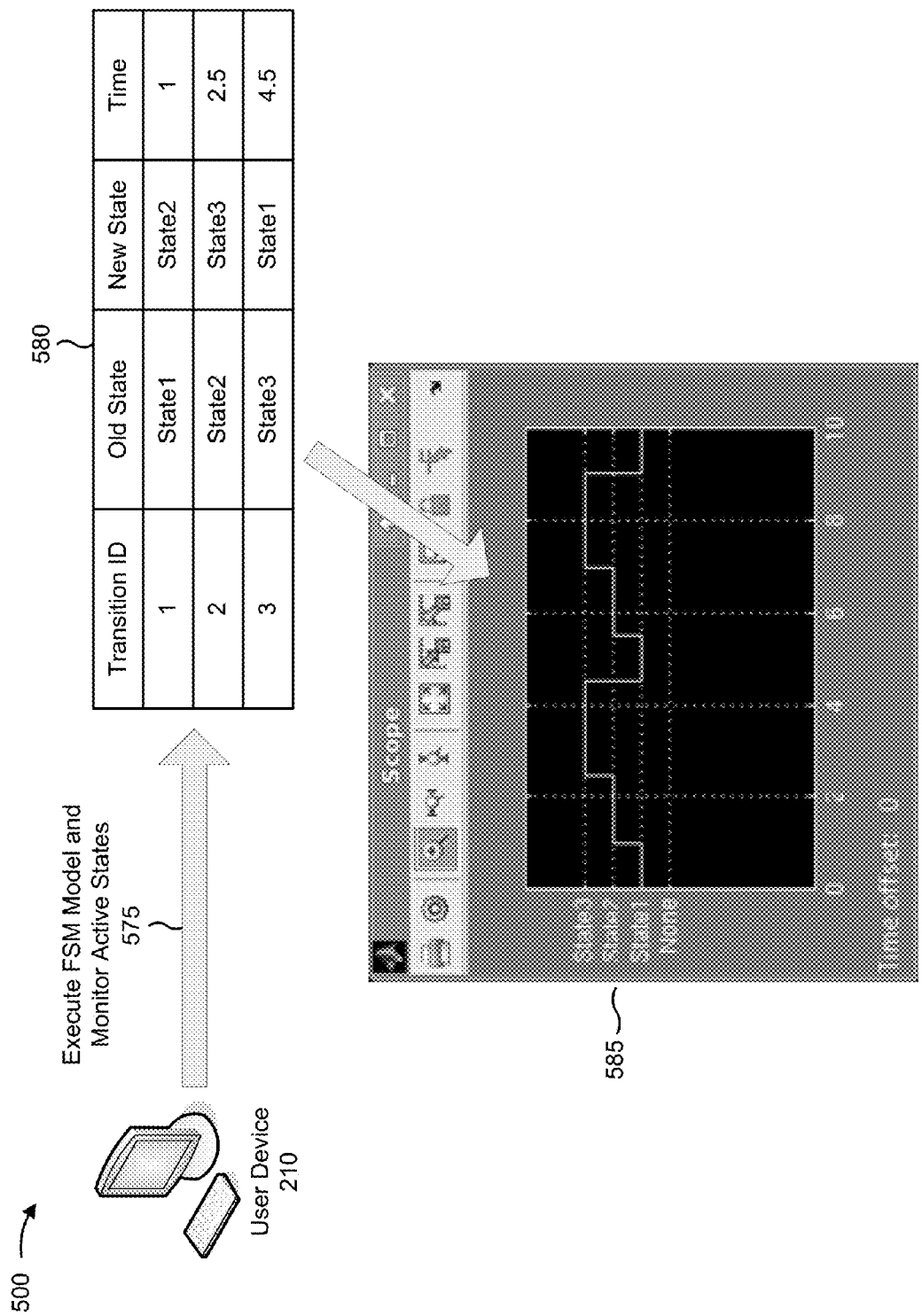

As shown in FIG. 5D (reference number 575), user device 210 may execute FSM model 510 and may monitor actives state of FSM model 510. In some implementations, user device 210 may execute FSM model 510 and/or monitor the active states based on the specified user options and/or the generated program code. For example, user device 210 may monitor different states (e.g., parent states and/or sub-states, such as child states, grandchild states, etc.) based on the user options and/or the program code.

As shown by reference number 580, user device 210 may monitor the active states by storing information associated with the active states in a data structure 580. For example, data structure 580 may store information that identifies a state transition (e.g., a state transition identifier), a state from which the FSM model is transitioning (e.g., an old state that is the active state immediately before the state transition), a state to which the FSM model is transitioning (e.g., a new state that is the active state immediately after the state transition), and a time at which the state transition occurred (e.g., an actual time, a simulated time, a time since a start of model execution, etc.). Additionally, or alternatively, data structure 580 may store information that identifies a time period and an active state of FSM model 510 during the time period (e.g., an indication of which state or states are active during the time period).

As shown by data structure 580, FSM model 510 may transition from State1 to State2 at time 1 during a first transition, may transition from State2 to State3 at time 2.5 during a second transition, and may transition from State3 to State1 at time 4.5 during a third transition. As shown by reference number 585, user device 210 may provide a visual representation (e.g., via a user interface) of the changes in the active state (and/or state transitions) over time. In this example, the visual representation includes a graph of time along the x axis, and the child states along the y axis (e.g., State1, State2, State3, and None). The graph indicates a child state that is active at a particular time.

FIGS. 6A-6D are diagrams of another example implementation 600 relating to example process 400 (FIG. 4).

Figure 6A:
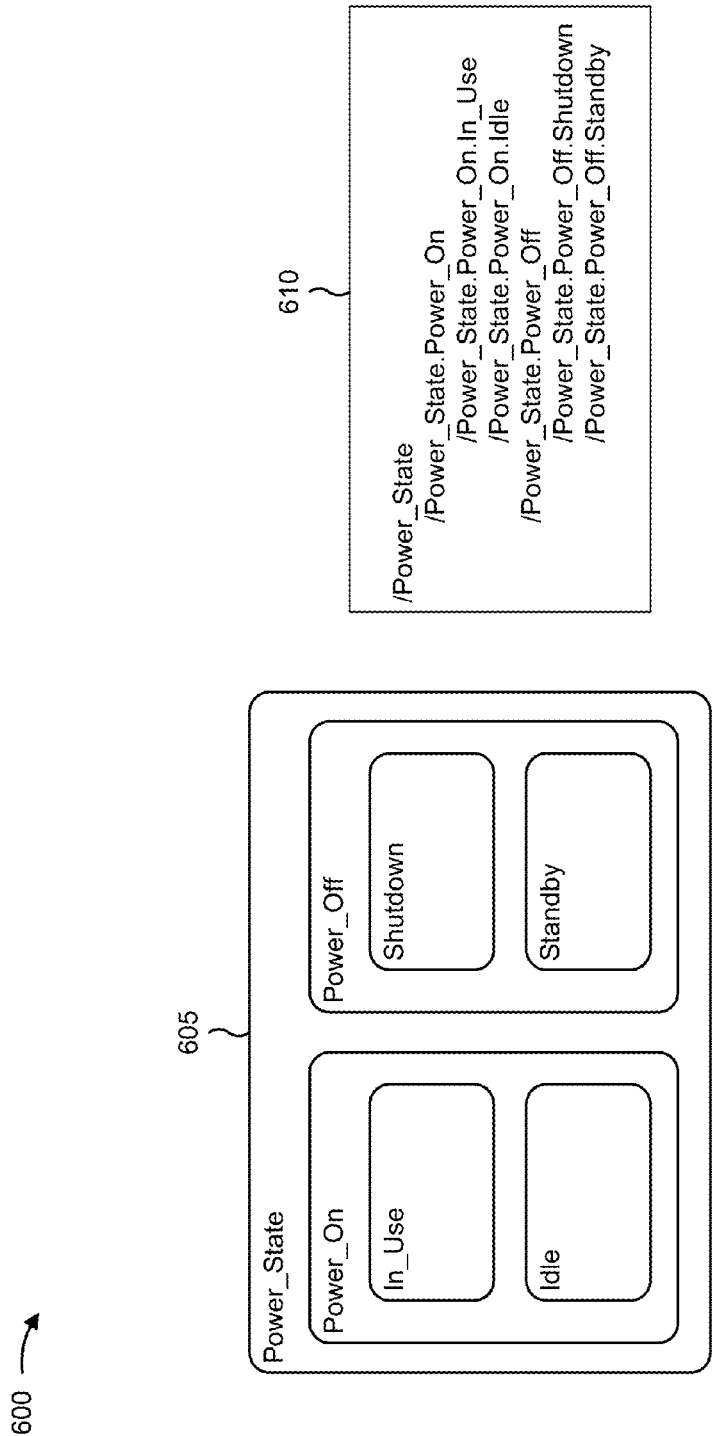
FIGS. 6A-6D are diagrams of another example implementation relating to the example process shown in FIG. 4.

FIG. 6A shows an example FSM model 605. In example implementation 600, assume that FSM model 605 models a power state (e.g., Power_State) of a computer. The computer may be powered on (e.g., in a Power_On state) or powered off (e.g., in a Power_Off state). When the computer is powered on, it may be in use (e.g., in an In_Use state) or idle (e.g., in an Idle state), which may be mutually exclusive states. When the computer is powered off (e.g., in a low power state), it may be in shutdown mode (e.g., in a Shutdown state) or standby mode (e.g., in a Standby state), which may be mutually exclusive states. This description of the computer may be modeled as FSM model 605, which may also be represented textually, as shown by reference number 610.

FSM model 605 may be modeled as a hierarchy of states. For example, the state named Power_State may be a parent state of two child states, named Power_On and Power_Off. The Power_On state may be a parent state of two child states, named In_Use and Idle. The Power_Off state may be a parent state of two child states, named Shutdown and Standby. The states named In_Use, Idle, Shutdown, and Standby are grandchild states of Power_State, and together with Power_On and Power_Off comprise the set of sub-states of Power_State. Furthermore, In_Use, Idle, Shutdown, and Standby are leaf states of Power_State.

Figure 6B:
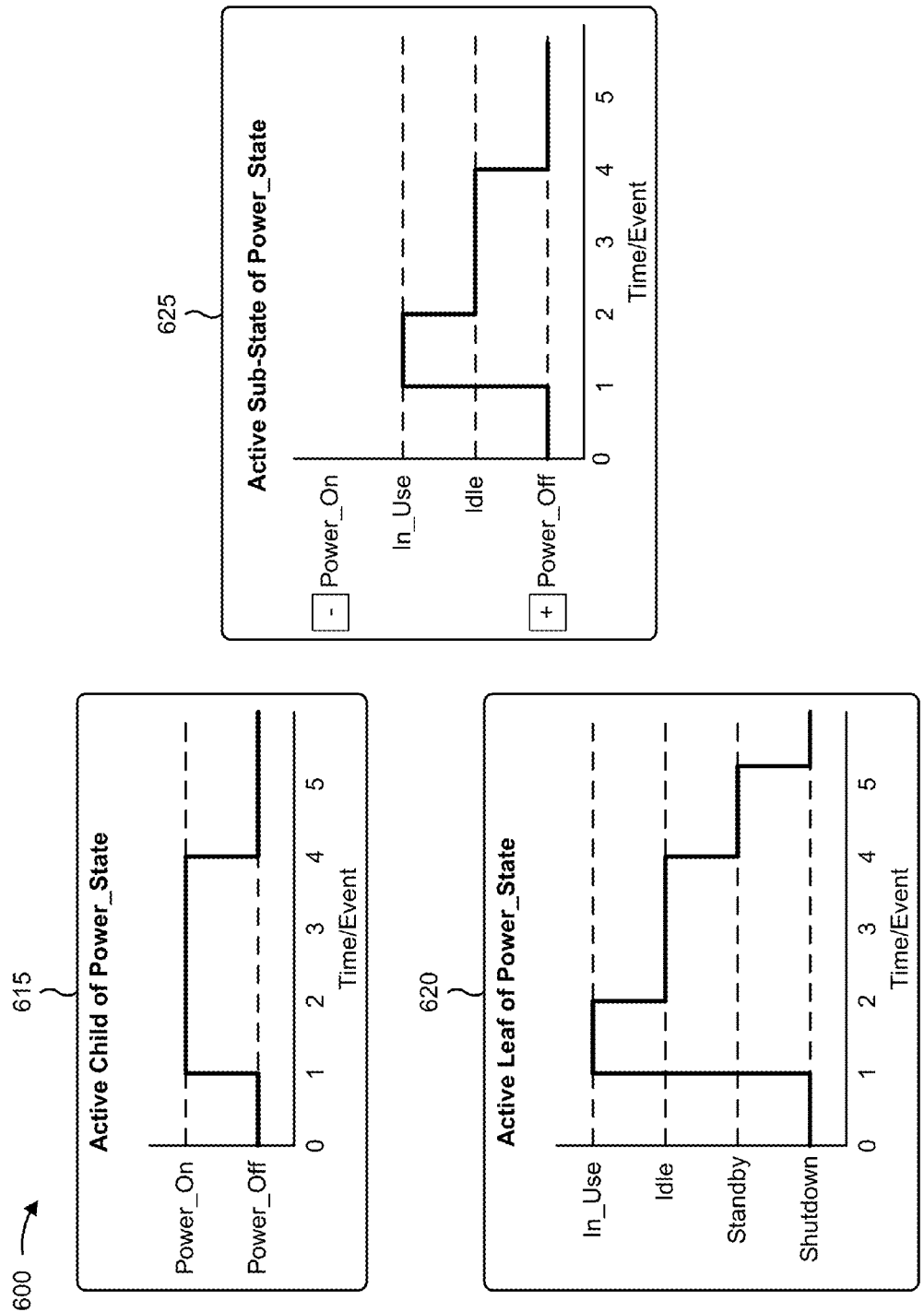

FIG. 6B shows example visual representations of FSM model 605. The visual representations may be provided by user device 210 based on execution of FSM model 605 and monitoring of the active states of FSM model 605.

For visual representation 615, assume that the user has input an option to monitor child activity (e.g., direct child states) of the parent state named Power_State. Based on FSM model 605, user device 210 may determine the child states of Power_State, and may monitor and/or report which of the child states are active at a particular time. For example, user device 210 may determine that Power_On or Power_Off are the child states of Power_State, and may monitor the Power_On or Power_Off states to determine when one of them is active at a particular time during model execution. User device 210 may report results of the monitoring via a user interface that provides visual representation 615.

As shown in visual representation 615, when user device 210 executes FSM model 605, the computer may be in the Power_Off state (e.g., at time 0). At time 1, the simulated computer may transition to the Power_On state, and may remain in the Power_On state until time 4, when the computer may transition back to the Power_Off state.

For visual representation 620, assume that the user has input an option to monitor leaf activity (e.g., leaf states, such as bottom-level states) of the parent state named Power_State. Based on FSM model 605, user device 210 may determine the leaf states of Power_State, and may monitor and/or report which of the leaf states are active at a particular time. For example, user device 210 may determine that In_Use, Idle, Standby, and Shutdown are the leaf states of Power_State, and may monitor the In_Use, Idle, Standby, and Shutdown states to determine when one of them is active at a particular time during model execution. User device 210 may report results of the monitoring via a user interface that provides visual representation 620.

Visual representation 620 may correspond to the same model execution as visual representation 615. As shown in visual representation 620, when user device 210 executes FSM model 605, the computer may be in the Shutdown state (e.g., at time 0). At time 1, the simulated computer may transition to the In_Use state. At time 2, the simulated computer may transition to the Idle state and may remain in the Idle state until time 4, when the computer may transition to the Standby state. At time 5, the computer may transition from the Standby state to the Shutdown state.

As shown in visual representation 625, a user may interact with a visual representation to indicate a manner in which information is to be displayed by the visual representation. For example, the user may expand or collapse a parent state to display or not display the child states of the parent state. In visual representation 625, the Power_Off state is collapsed so that the Standby and Shutdown states are not visible. Conversely, the Power_On state is expanded so that the In_Use and Idle states are visible. Visual representation 625 may correspond to the same model execution as visual representations 615 and 620.

Figure 6C:
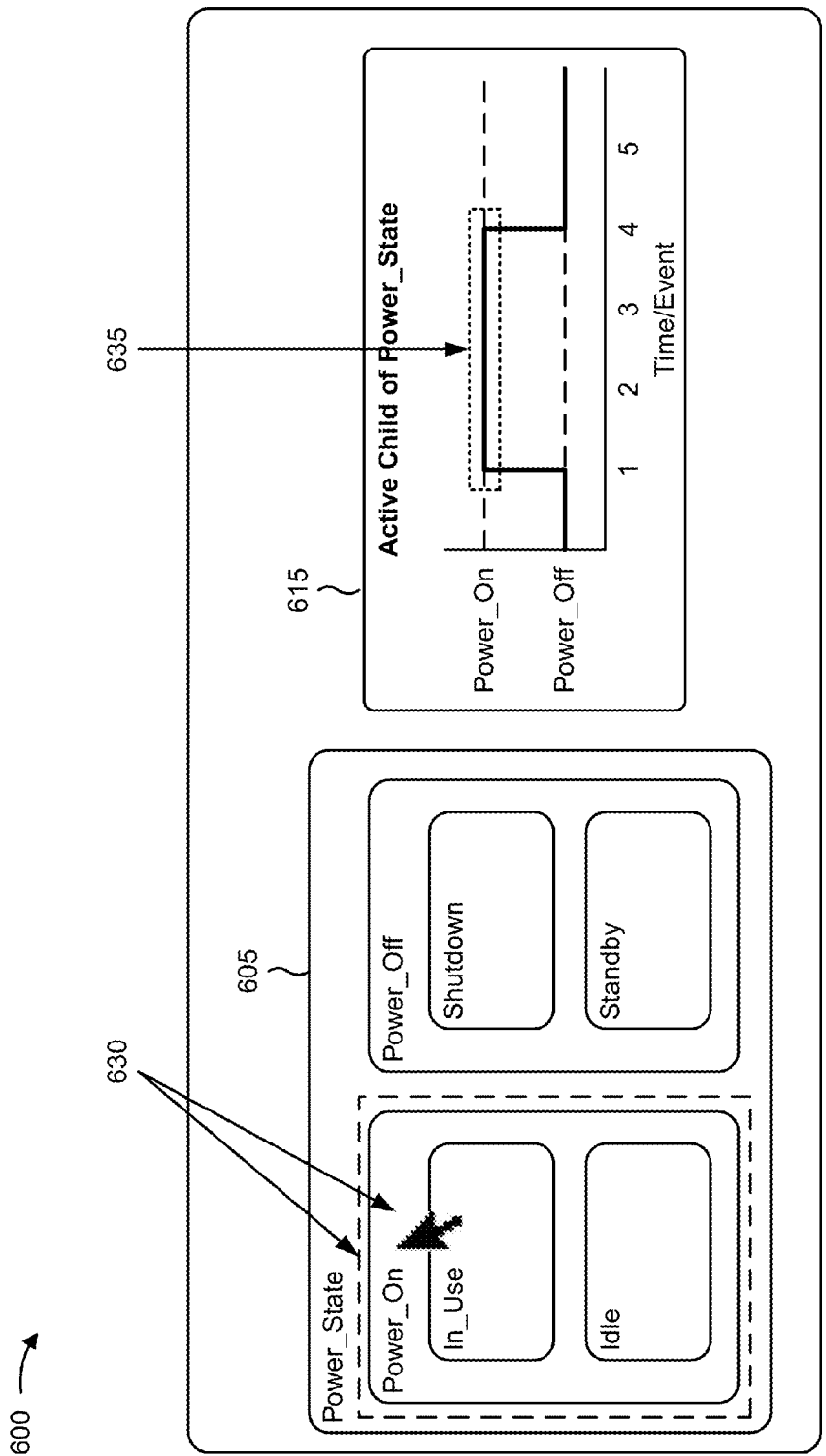

As shown in FIG. 6C, a user may interact with a representation of the FSM model, and such interaction may cause information to be provided via the visual representation. For example, the user may select a state of FSM model 605, such as the Power_On state, as shown by reference number 630. Based on the selection, user device 210 may highlight and/or otherwise provide an indication, on the representation of FSM model 605, that the user has selected the Power_On state. Additionally, or alternatively, user device 210 may highlight and/or otherwise provide an indication, on visual representation 615, of a portion of visual representation 615 associated with the selected Power_On state. For example, user device 210 may highlight a portion of the graph corresponding to a time period during which the Power_On state is the active state, as shown by reference number 635.

Figure 6D:
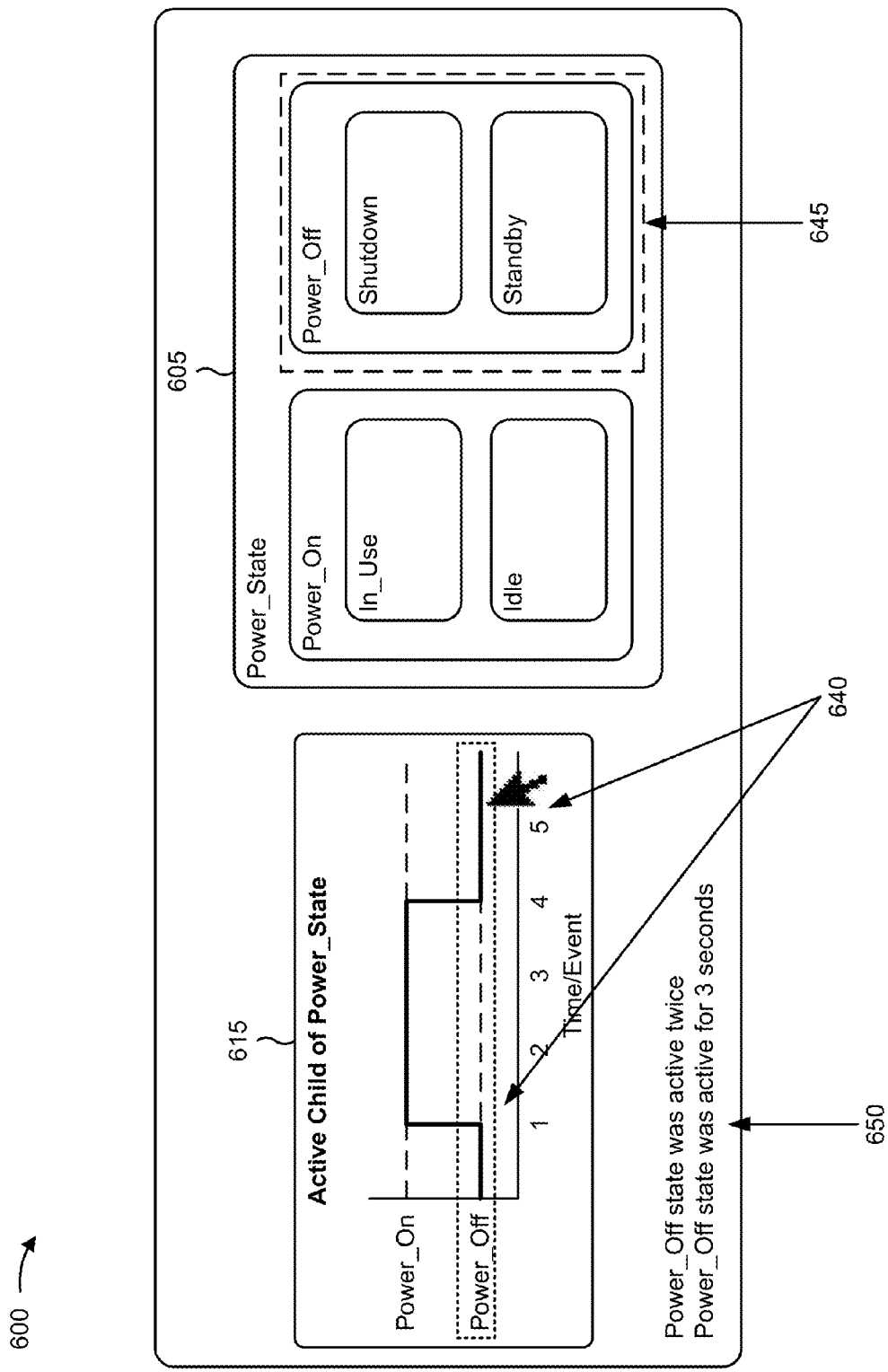

As shown in FIG. 6D, a user may interact with the visual representation, and such interaction may cause information to be provided via the representation of the FSM model. For example, the user may select a portion of the graph associated with a particular state of FSM model 605, such as the Power_Off state, as shown by reference number 640. Based on the selection, user device 210 may highlight and/or otherwise provide an indication, on the visual representation, that the user has selected the Power_Off State. Additionally, or alternatively, user device 210 may highlight and/or otherwise provide an indication, on the representation of FSM model 605, of a portion of the representation that corresponds to the selected Power_Off state, as shown by reference number 645.

In some implementations, user device 210 may provide, via a user interface, information associated with a selected state. For example, based on user selection of the Power_Off state, user device 210 may provide information that identifies a quantity of times that the Power_Off state was active (e.g., "Power_Off state was active twice") and a total amount of time that the Power_Off state was active during model execution (e.g., "Power_Off state was active for 3 seconds"), as shown by reference number 650.

Figure 7A:
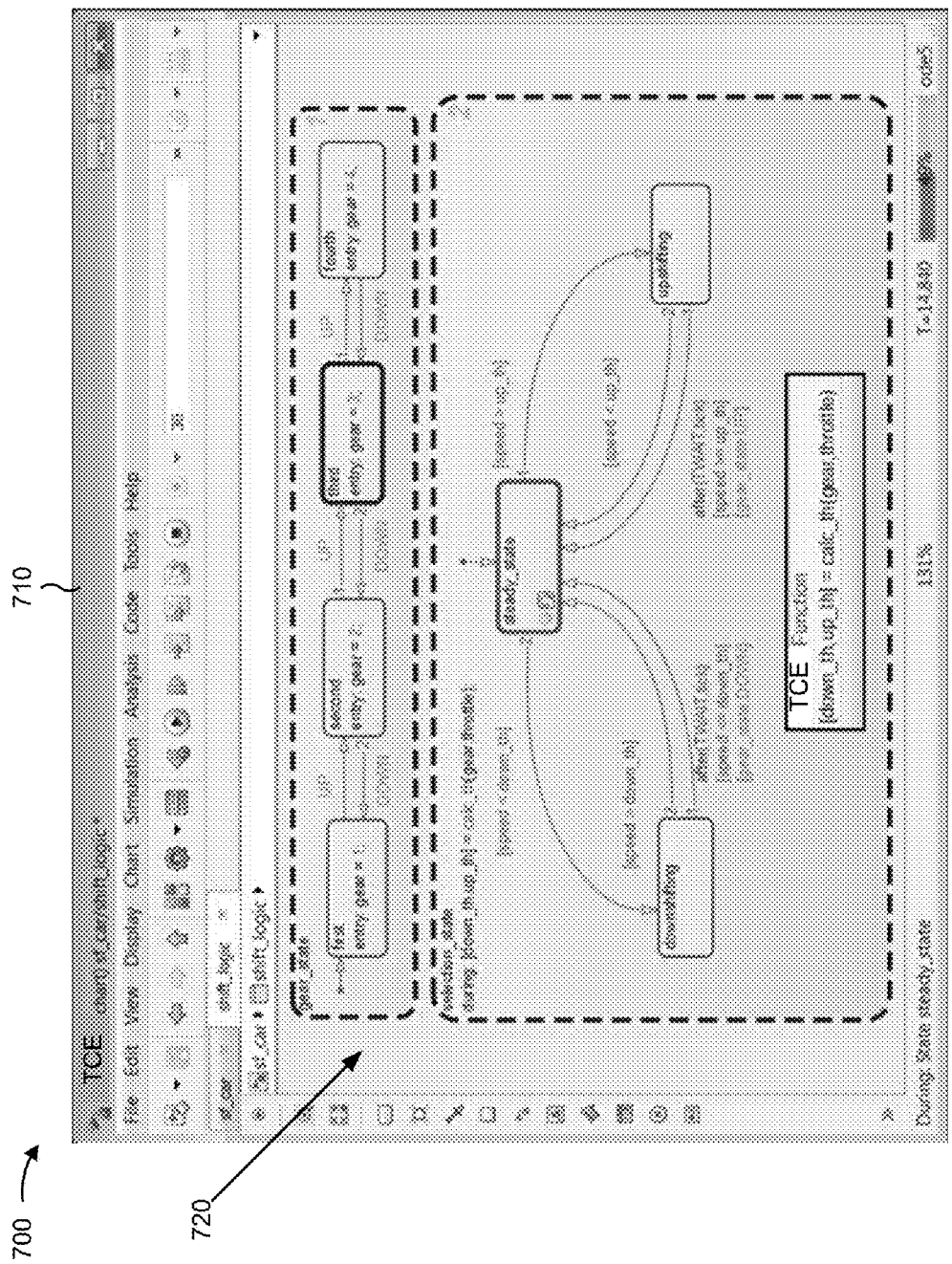
FIGS. 7A-7C are diagrams of yet another example implementation relating to the example process shown in FIG. 4.
Figure 7B:
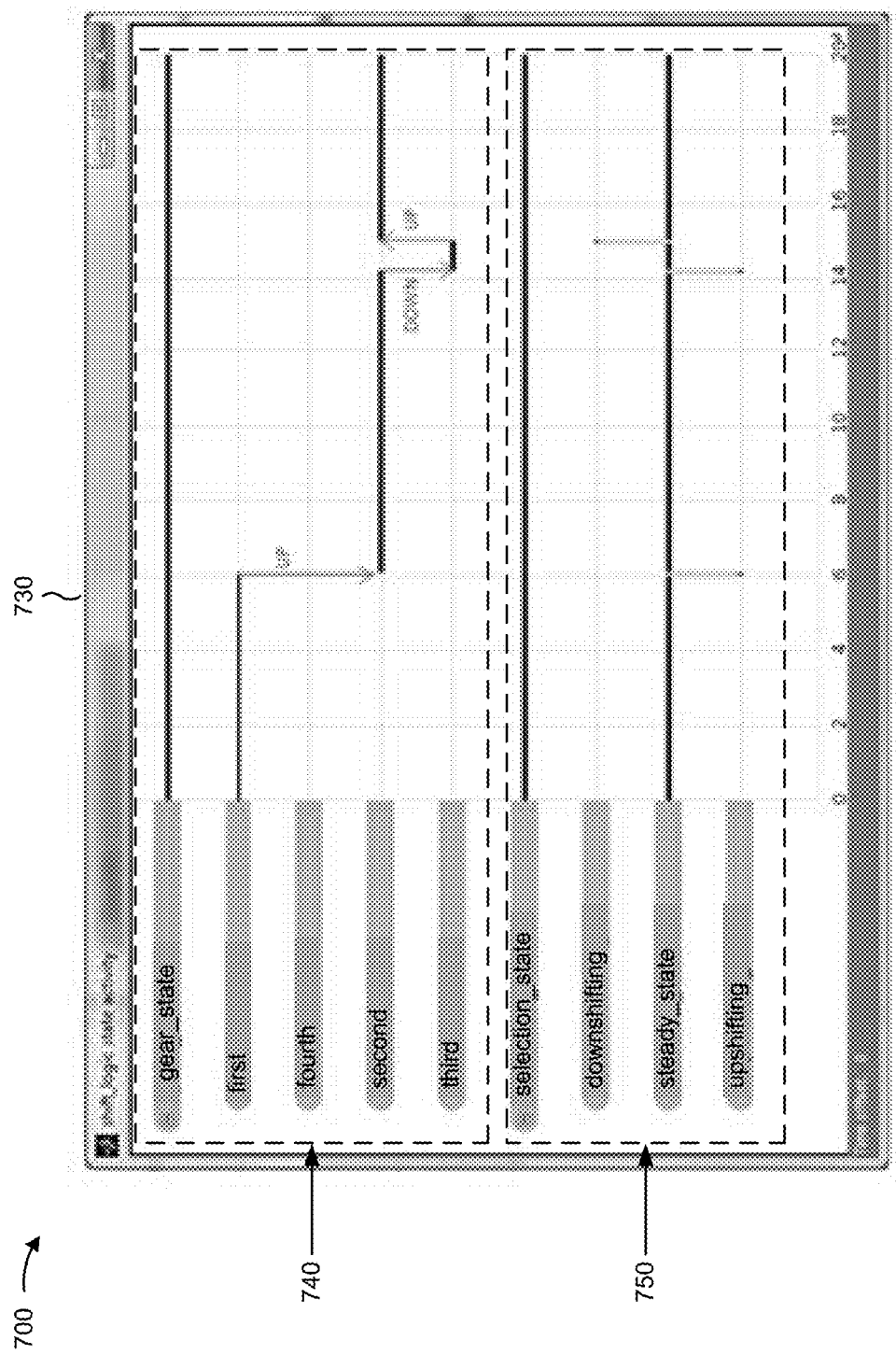
Figure 7C:
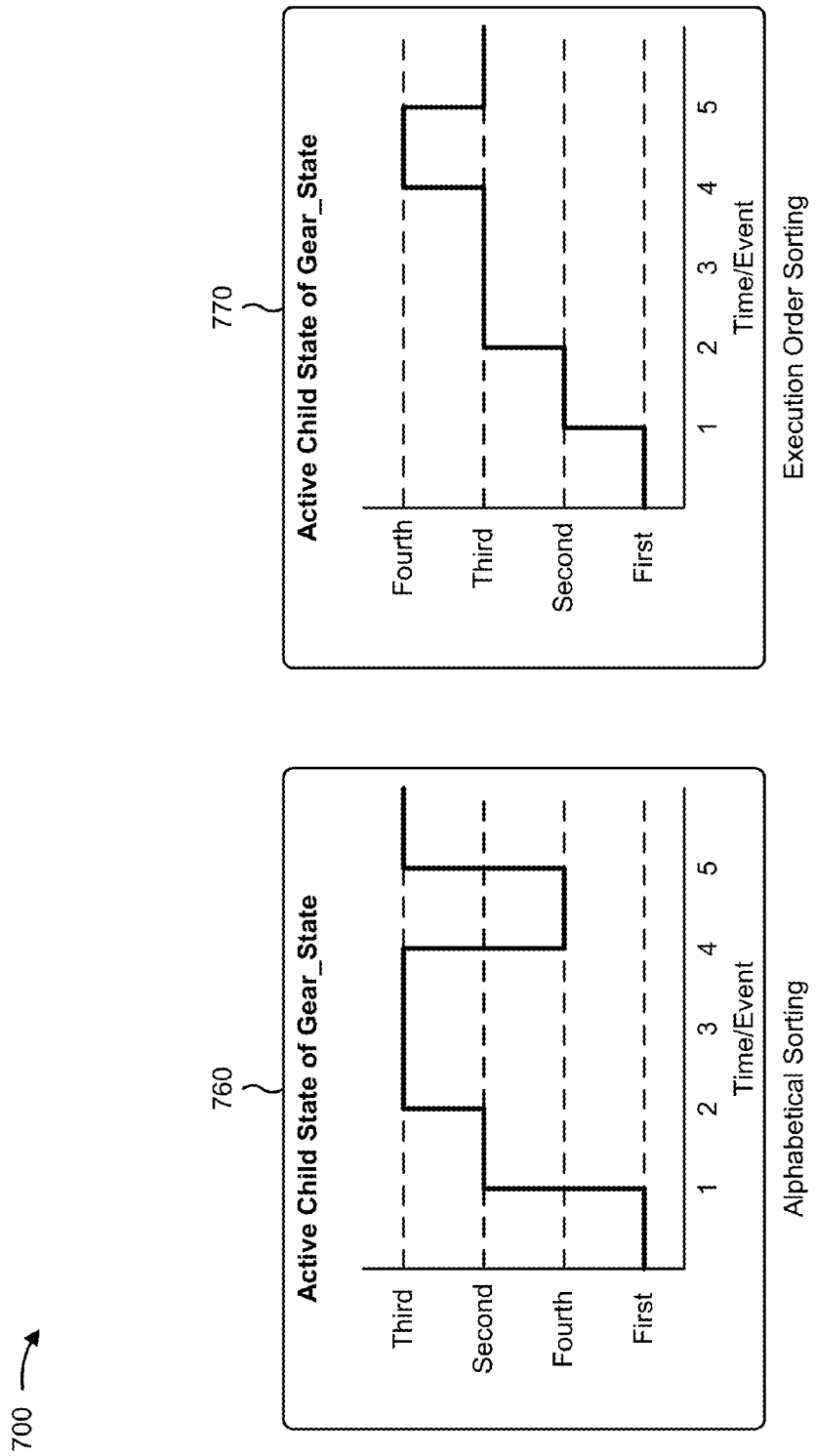

FIGS. 7A-7C are diagrams of yet another example implementation 700 relating to example process 400 (FIG. 4).

As shown in FIG. 7A, user device may provide, via a user interface 710, an FSM model 720 of an automatic transmission of a car. Assume that FSM model 720 models a transmission with four gear states: first gear, second gear, third gear, and fourth gear. The automatic transmission may transition between gear states based on an upshift or a downshift.

FIG. 7B shows an example user interface 730 that depicts a visual representation that may be provided by user device 210 based on execution of FSM model 720. For example, user interface 730 provides a first visual portion 740 that depicts an active gear state (e.g., first, second, third, or fourth). User interface 730 also provides a second visual portion 750 that depicts state transitions (e.g., a downshift transition, an upshift transition, or no transition (steady state)).

FIG. 7C shows an example of how an enumeration order may affect the manner in which states are depicted by the visual representation. For example, visual representation 760 may be created from an alphabetical enumeration order (e.g., First, Fourth, Second, Third, from bottom to top). The program code used to generate visual representation 760 may include, for example, the following program code:

```
classdef gear_state<TCE.IntEnumType
    enumeration
        First(1)
        Fourth(2)
        Second(3)
        Third(4)
    end
end.
```

As another example, visual representation 770 may be created from an enumeration order that is based on an order in which the states are activated during execution of FSM model 720 (e.g., First, Second, Third, Fourth, from bottom to top). The program code used to generate visual representation 770 may include, for example, the following program code

```
classdef gear_state<TCE.IntEnumType
    enumeration
        First(1)
        Second(2)
        Third(3)
        Fourth(4)
    end
end.
```

As can be seen, visual representation 770 provides the user with a better understanding of the states and state transitions as compared to visual representation 760. In some implementations, a user may interact with visual representation 770 to change the order of the states. For example, a user may drag and drop the "First" label above the "Second" label to switch the order of the "First" and "Second" states.

In some implementations, the enumerated data type code (and/or other program code) used to generate visual representation 770 may be generated by user device 210 when compiling the program code. Additionally, or alternatively, user device 210 may generate a data structure that includes the enumerated data type code, based on executing the program code, and may provide the data structure as output for reuse and/or may generate the program code based on the data structure.

The foregoing disclosure provides illustration and description, but is not intended to be exhaustive or to limit the implementations to the precise form disclosed. Modifications and variations are possible in light of the above disclosure or may be acquired from practice of the implementations.

As used herein, component is intended to be broadly construed as hardware, firmware, or a combination of hardware and software.

As used herein, program code is to be broadly interpreted to include text-based code that may not require further processing to execute (e.g., C++ code, Hardware Description Language (HDL) code, very-high-speed integrated circuits (VHSIC) HDL(VHDL) code, Verilog, Java, and/or other types of hardware or software based code that may be compiled and/or synthesized); binary code that may be executed (e.g., executable files that may directly be executed by an operating system, bitstream files that can be used to configure a field programmable gate array (FPGA), Java byte code, object files combined together with linker directives, source code, makefiles, etc.); text files that may be executed in conjunction with other executables (e.g., Python text files, a collection of dynamic-link library (DLL) files with text-based combining, configuration information that connects pre-compiled modules, an extensible markup language (XML) file describing module linkage, etc.); etc. In one example, program code may include different combinations of the above-identified classes (e.g., text-based code, binary code, text files, etc.). Additionally, or alternatively, program code may include code generated using a dynamically-typed programming language (e.g., the M language, a MATLAB® language, a MATLAB-compatible language, a MATLAB-like language, etc.) that can be used to express problems and/or solutions in mathematical notations. Additionally, or alternatively, program code may be of any type, such as a function, a script, an object, etc., and a portion of program code may include one or more characters, lines, etc. of the program code.

Certain data structures have been described herein. While the described data structures may be represented as a table with rows and columns, in practice, the data structures may include any type of data structure, such as a linked list, a tree, a hash table, a database, or any other type of data structure. In some implementations, the data structures may include information generated by a device and/or a component. Additionally, or alternatively, the data structures may include information provided from another source, such as information provided by a user, and/or information automatically provided by a device.

It will be apparent that systems and/or methods, as described herein, may be implemented in many different forms of software, firmware, and hardware in the implementations illustrated in the figures. The actual software code or specialized control hardware used to implement these systems and/or methods is not limiting of the implementations. Thus, the operation and behavior of the systems and/or methods were described without reference to the specific software code—it being understood that software and control hardware can be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Where only one item is intended, the term "one" or similar language is used. Further, the phrase "based on" is intended to mean "based, at least in part, on" unless explicitly stated otherwise.

What is claimed is:

1. A device, comprising:
one or more processors to:
receive information that identifies a model of a finite state machine,
the model including information that identifies a parent state and a plurality of sub-states of the parent state;
generate a data structure that designates an enumerated data type associated with the parent state,
the enumerated data type including an ordered list of a plurality of values corresponding to an order associated with the plurality of sub-states,
the order associated with the plurality of sub-states being based on at least one of:
a particular order in which the plurality of sub-states become active during execution of the model,
information specifying the order associated with the plurality of sub-states, or
durations of time that the plurality of sub-states are active during execution of the model;
execute the model based on the data structure;
monitor operation of the finite state machine and one or more state transitions among at least some of the plurality of sub-states, based on executing the model;
detect, based on the one or more state transitions, a change in an active sub-state that represents a particular sub-state, of the plurality of sub-states, that is active at a particular time during execution of the model; and
provide, based on detecting the change, state transition information that identifies a plurality of changes in the active sub-state,
the plurality of changes including the change.

2. The device of claim 1, where the plurality of sub-states include at least one of:
a plurality of child states of the parent state, the plurality of child states being directly associated with the parent state in the model, with no intervening states; or
a plurality of bottom-level sub-states of the parent state, the plurality of bottom-level sub-states not being parent states.

3. The device of claim 1, where each value, of the plurality of values, is identified by a name used to identify a corresponding sub-state, of the plurality of sub-states, in the model.

4. The device of claim 1, where the one or more processors, when providing the state transition information, are to:
depict a visual representation of the plurality of sub-states, based on the order associated with the plurality of sub-states; and
depict, via the visual representation, the plurality of changes in the active sub-state.

5. The device of claim 1, where the one or more processors, when detecting the change in the active sub-state, are to:
detect a state transition, of the one or more state transitions, that occurs at a first time during model execution;
determine a first sub-state, of the plurality of sub-states, that is active at a second time immediately preceding the first time;
determine a second sub-state, of the plurality of sub-states, that is active at a third time immediately following the first time; and
where the one or more processors, when providing the state transition information, are to:
provide an indication that the state transition occurred at the first time, that the first sub-state was active at the second time, and that the second sub-state was active at the third time.

6. The device of claim 1, where the one or more processors, when providing the state transition information, are to at least one of:
provide the state transition information as input to an element of the model; or
provide the state transition information as input to another model.

7. A non-transitory computer-readable medium storing instructions, the instructions comprising:
one or more instructions that, when executed by a processor, cause the processor to:
receive information that identifies a model of a finite state machine,
the model including information that identifies a parent state and a plurality of sub-states of the parent state;
generate a data structure that designates an enumerated data type associated with the parent state,
the enumerated data type including an ordered list of a plurality of values corresponding to an order associated with the plurality of sub-states,
the order associated with the plurality of sub-states being based on at least one of:
a particular order in which the plurality of sub-states become active during execution of the model,
information specifying the order associated with the plurality of sub-states, or
durations of time that the plurality of sub-states are active during execution of the model;
execute the model, based on the data structure;
monitor operation of the finite state machine and one or more state transitions among at least some of the plurality of sub-states, based on executing the model;
detect, based on the one or more state transitions, a change in an active sub-state that represents a particular sub-state, of the plurality of sub-states, that is active at a particular time during execution of the model; and
provide, based on detecting the change and the particular order, a visual representation of a plurality of changes in the active sub-state,
the plurality of changes including the change.

8. The non-transitory computer-readable medium of claim 7, where the plurality of sub-states include at least one of:
a plurality of child states of the parent state, the plurality of child states being directly associated with the parent state in the model, with no intervening states; or
a plurality of bottom-level sub-states of the parent state, the plurality of bottom-level sub-states not being parent states.

9. The non-transitory computer-readable medium of claim 7, where each value, of the plurality of values, is identified by a name used to identify a corresponding sub-state, of the plurality of sub-states, in the model.

10. The non-transitory computer-readable medium of claim 7, where the one or more instructions, that cause the processor to provide the visual representation, cause the processor to:
provide a representation of the plurality of sub-states based on the order associated with the plurality of sub-sates.

11. The non-transitory computer-readable medium of claim 7, where the information specifying the order associated with the plurality of sub-states includes at least one of:
information specifying an order in which the plurality of sub-states are identified in a state transition table associated with the model;
information specifying an alphabetical or alphanumeric order of a plurality of names used to identify the plurality of sub-states in the model;
information specifying a default transition flow graph identified in the model;
information specifying a distance between each of the plurality of sub-states and a default state identified in the model;
or
information specifying a layout of the model in a block diagram; and
where the one or more instructions, that cause the processor to provide the visual representation, cause the processor to:
depict a representation of the plurality of sub-states based on the order associated with the plurality of sub-states.

12. The non-transitory computer-readable medium of claim 7, where the one or more instructions, that cause the processor to detect the change in the active sub-state, cause the processor to:
detect a state transition, of the one or more state transitions, that occurs at a first time during model execution;
determine a first sub-state, of the plurality of sub-states, that is active at a second time immediately preceding the first time;
determine a second sub-state, of the plurality of sub-states, that is active at a third time immediately following the first time; and
where the one or more instructions, that cause the processor to provide the visual representation, cause the processor to:
provide an indication that the state transition occurred at the first time, that the first sub-state was active at the second time, and that the second sub-state was active at the third time.

13. The non-transitory computer-readable medium of claim 7, where the parent state is one of a plurality of parent states included in the model; and
where the one or more instructions further cause the processor to:
receive information that identifies a particular parent state, of the plurality of parent states; and
provide, via the visual representation, an indication of changes in active sub-states associated with the particular parent state.

14. The non-transitory computer-readable medium of claim 7, where the one or more instructions further cause the processor to:
receive, via user interaction with the visual representation, a selection of a sub-state, of the plurality of sub-states; and
provide, via a user interface, a representation of the model, other than the visual representation, that includes an indication of the selected sub-state.

15. A method, comprising:
receiving information that identifies a model of a finite state machine,
the model including information that identifies a parent state and a plurality of sub-states of the parent state, the receiving being performed by a device;
generating program code that designates an enumerated data type associated with the parent state,
the enumerated data type including an ordered list of a plurality of values corresponding to an order associated with the plurality of sub-states,
the order associated with the plurality of sub-states being based on at least one of:
a particular order in which the plurality of sub-states become active during execution of the model,
information specifying the order associated with the plurality of sub-states, or
durations of time that the plurality of sub-states are active during execution of the model
the generating being performed by the device;
executing the model and the generated program code to monitor operation of the finite state machine and a plurality of state transitions among at least some of the plurality of sub-states,
the executing being performed by the device;
detecting, during execution of the model, a state transition of the plurality of state transitions,
the detecting being performed by the device; and
providing a visual representation of the state transition,
the providing being performed by the device.

16. The method of claim 15, where the plurality of sub-states includes a plurality of child states of the parent state, the plurality of child states being directly associated with the parent state in the model, with no intervening states.

17. The method of claim 15, where the plurality of sub-states includes a plurality of bottom-level sub-states of the parent state, the plurality of bottom-level sub-states not being parent states.

18. The method of claim 15, where providing the visual representation comprises:
depicting a representation of the plurality of sub-states based on the order associated with the plurality of sub-states.

19. The method of claim 15, where the information specifying the order associated with the plurality of sub-states includes at least one of:
information specifying an order in which the plurality of sub-states are identified in a state transition table associated with the model;
information specifying an alphabetical or alphanumeric order of a plurality of names used to identify the plurality of sub-states in the model;
information specifying a default transition flow graph identified in the model; information specifying a distance between each of the plurality of sub-states and a default state identified in the model; or
information specifying a layout of the model in a block diagram.

20. The method of claim 15, where detecting the state transition comprises:
determining that the state transition occurs at a first time during model execution;
determining a first sub-state, of the plurality of sub-states, that is active at a second time immediately preceding the first time;
determining a second sub-state, of the plurality of sub-states, that is active at a third time immediately following the first time, and
where providing the visual representation comprises:
providing an indication that the state transition occurred at the first time, that the first sub-state was active at the second time, and that the second sub-state was active at the third time.

* * * * *

UNITED STATES PATENT AND TRADEMARK OFFICE
CERTIFICATE OF CORRECTION

| | | |
|---|---|---|
| PATENT NO. | : 9,507,888 B1 | Page 1 of 1 |
| APPLICATION NO. | : 13/834917 | |
| DATED | : November 29, 2016 | |
| INVENTOR(S) | : Nishith Aggarwal et al. | |

It is certified that error appears in the above-identified patent and that said Letters Patent is hereby corrected as shown below:

In the Claims

Column 20, Line 67, Claim 10 change "sub-sates" to --sub-states--

Signed and Sealed this
Eleventh Day of April, 2017

Michelle K. Lee
*Director of the United States Patent and Trademark Office*